(12) United States Patent
Holmgren et al.

(10) Patent No.: US 12,299,238 B2
(45) Date of Patent: *May 13, 2025

(54) CONTACTLESS TOUCH INPUT SYSTEM

(71) Applicant: NEONODE INC., San Jose, CA (US)

(72) Inventors: Stefan Johannes Holmgren, Sollentuna (SE); Jan Tomas Hartman, Kumla (SE); Tom Richard Berglind, Älvsjö (SE); Lars Bertil Sparf, Vällingby (SE); Jonas Daniel Justus Hjelm, Bandhagen (SE); Jon Elis Gösta Karlsson, Märsta (SE); Per Carl Sture Rosengren, Täby (SE); Gunnar Martin Fröjdh, Dalarö (SE); Joseph Shain, Stockholm (SE); Xiatao Wang, Lidingö (SE); Clarence Ray King, III, Solana Beach, CA (US); Oscar Ritzén Praglowski de Radwan, Stockholm (SE)

(73) Assignee: Neonode Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/532,390

(22) Filed: Dec. 7, 2023

(65) Prior Publication Data
US 2024/0118771 A1 Apr. 11, 2024

Related U.S. Application Data

(63) Continuation of application No. 17/788,456, filed as application No. PCT/US2020/067599 on Dec. 30, 2020, now Pat. No. 11,842,014.
(Continued)

(51) Int. Cl.
G06F 3/042 (2006.01)
G01V 8/20 (2006.01)
(Continued)

(52) U.S. Cl.
CPC .............. *G06F 3/0421* (2013.01); *G01V 8/20* (2013.01); *G06F 3/017* (2013.01); *G06F 3/0416* (2013.01); *G06F 2203/04108* (2013.01)

(58) Field of Classification Search
CPC ...... G06F 3/0421; G06F 3/017; G06F 3/0416; G06F 2203/04108; G06F 3/0304;
(Continued)

(56) References Cited

U.S. PATENT DOCUMENTS 4,243,879 A 1/1981 Carroll et al.
4,267,443 A 5/1981 Carroll et al.
(Continued)

FOREIGN PATENT DOCUMENTS

DE 202014104143 U1 10/2014
EP 0601651 A1 6/1994
(Continued)

OTHER PUBLICATIONS

Translation for Publication JP2019074933A.
(Continued)

*Primary Examiner* — Grant Sitta
(74) *Attorney, Agent, or Firm* — Soquel Group LLC

(57) ABSTRACT

A proximity sensor including a structure suspending at least one lens above a circuit board, light emitters operable to project light beams through the lens along a common projection plane, light detectors operable to detect amounts of light arriving through the lens at the detector, wherein an object in the projection plane reflects light from an emitter to one or more of the detectors, and wherein each emitter-detector pair, including one of the emitters and one of the detectors, when synchronously activated, is expected to generate a greater detection signal at the activated detector than the other detectors, were they to be synchronously activated with any of the emitters, when the object is located
(Continued)

at a specific 2D location in the projection plane corresponding to the emitter-detector pair, and a processor identifying gestures performed by the object based on amounts of light detected by the detector of each emitter-detector pair.

11 Claims, 32 Drawing Sheets

Related U.S. Application Data

(60) Provisional application No. 63/080,656, filed on Sep. 18, 2020, provisional application No. 63/030,919, filed on May 27, 2020, provisional application No. 62/956,058, filed on Dec. 31, 2019.

(51) Int. Cl.
  *G06F 3/01* (2006.01)
  *G06F 3/041* (2006.01)

(58) Field of Classification Search
  CPC ..... G06F 3/04883; G06F 3/0428; G01V 8/20; H03K 2217/94104; H03K 17/943
  See application file for complete search history.

(56) References Cited

U.S. PATENT DOCUMENTS

| | | | |
|---|---|---|---|
| 4,301,447 A | 11/1981 | Funk et al. |
| 4,542,291 A | 9/1985 | Zimmerman |
| 4,588,258 A | 5/1986 | Hoopman |
| 4,593,191 A | 6/1986 | Alles |
| 4,641,426 A | 2/1987 | Hartman et al. |
| 4,672,364 A | 6/1987 | Lucas |
| 4,703,316 A | 10/1987 | Sherbeck |
| 4,761,637 A | 8/1988 | Lucas et al. |
| 4,928,094 A | 5/1990 | Smith |
| 4,988,981 A | 1/1991 | Zimmerman et al. |
| 5,036,187 A | 7/1991 | Yoshida et al. |
| 5,070,411 A | 12/1991 | Suzuki |
| 5,103,085 A | 4/1992 | Zimmerman |
| 5,162,783 A | 11/1992 | Moreno |
| 5,194,863 A | 3/1993 | Barker et al. |
| 5,220,409 A | 6/1993 | Bures |
| 5,414,413 A | 5/1995 | Tamaru et al. |
| 5,463,725 A | 10/1995 | Henckel et al. |
| 5,559,727 A | 9/1996 | Deley et al. |
| 5,577,733 A | 11/1996 | Downing |
| 5,603,053 A | 2/1997 | Gough et al. |
| 5,729,250 A | 3/1998 | Bishop et al. |
| 5,748,185 A | 5/1998 | Stephan et al. |
| 5,825,352 A | 10/1998 | Bisset et al. |
| 5,880,462 A | 3/1999 | Hsia |
| 5,889,236 A | 3/1999 | Gillespie et al. |
| 5,900,863 A | 5/1999 | Numazaki |
| 5,914,709 A | 6/1999 | Graham et al. |
| 5,936,615 A | 8/1999 | Waters |
| 5,943,044 A | 8/1999 | Martinelli et al. |
| 5,946,134 A | 8/1999 | Benson et al. |
| 5,977,888 A | 11/1999 | Fujita et al. |
| 5,988,645 A | 11/1999 | Downing |
| 6,010,061 A | 1/2000 | Howell |
| 6,035,180 A | 3/2000 | Kubes et al. |
| 6,091,405 A | 7/2000 | Lowe et al. |
| 6,161,005 A | 12/2000 | Pinzon |
| 6,333,735 B1 | 12/2001 | Anvekar |
| 6,340,979 B1 | 1/2002 | Beaton et al. |
| 6,362,468 B1 | 3/2002 | Murakami et al. |
| 6,377,238 B1 | 4/2002 | McPheters |
| 6,421,042 B1 | 7/2002 | Omura et al. |
| 6,429,857 B1 | 8/2002 | Masters et al. |
| 6,492,978 B1 | 12/2002 | Selig et al. |
| 6,646,633 B1 | 11/2003 | Nicolas |
| 6,690,365 B2 | 2/2004 | Hinckley et al. |
| 6,690,387 B2 | 2/2004 | Zimmerman et al. |
| 6,707,449 B2 | 3/2004 | Hinckley et al. |
| 6,757,002 B1 | 6/2004 | Oross et al. |
| 6,762,077 B2 | 7/2004 | Schuurmans et al. |
| 6,788,292 B1 | 9/2004 | Nako et al. |
| 6,803,906 B1 | 10/2004 | Morrison et al. |
| 6,836,367 B2 | 12/2004 | Seino et al. |
| 6,864,882 B2 | 3/2005 | Newton |
| 6,874,683 B2 | 4/2005 | Keronen et al. |
| 6,875,977 B2 | 4/2005 | Wolter et al. |
| 6,947,032 B2 | 9/2005 | Morrison et al. |
| 6,954,197 B2 | 10/2005 | Morrison et al. |
| 6,972,401 B2 | 12/2005 | Akitt et al. |
| 6,972,834 B1 | 12/2005 | Oka et al. |
| 6,985,137 B2 | 1/2006 | Kaikuranta |
| 7,030,861 B1 | 4/2006 | Westerman et al. |
| 7,046,232 B2 | 5/2006 | Inagaki et al. |
| 7,054,045 B2 | 5/2006 | McPheters et al. |
| 7,133,032 B2 | 11/2006 | Cok |
| 7,162,124 B1 | 1/2007 | Gunn, III et al. |
| 7,170,590 B2 | 1/2007 | Kishida |
| 7,176,905 B2 | 2/2007 | Baharav et al. |
| 7,184,030 B2 | 2/2007 | McCharles et al. |
| 7,221,462 B2 | 5/2007 | Cavallucci |
| 7,225,408 B2 | 5/2007 | ORourke |
| 7,232,986 B2 | 6/2007 | Worthington et al. |
| 7,339,580 B2 | 3/2008 | Westerman et al. |
| 7,352,940 B2 | 4/2008 | Charters et al. |
| 7,369,724 B2 | 5/2008 | Deane |
| 7,372,456 B2 | 5/2008 | McLintock |
| 7,429,706 B2 | 9/2008 | Ho |
| 7,518,738 B2 | 4/2009 | Cavallucci et al. |
| 7,619,617 B2 | 11/2009 | Morrison et al. |
| 7,659,887 B2 | 2/2010 | Larsen et al. |
| 7,855,716 B2 | 12/2010 | McCreary et al. |
| 7,924,264 B2 | 4/2011 | Ohta |
| 8,022,941 B2 | 9/2011 | Smoot |
| 8,091,280 B2 | 1/2012 | Hanzel et al. |
| 8,115,745 B2 | 2/2012 | Gray |
| 8,120,625 B2 | 2/2012 | Hinckley |
| 8,139,045 B2 | 3/2012 | Jang et al. |
| 8,169,404 B1 | 5/2012 | Boillot |
| 8,193,498 B2 | 6/2012 | Cavallucci et al. |
| 8,243,047 B2 | 8/2012 | Chiang et al. |
| 8,269,740 B2 | 9/2012 | Sohn et al. |
| 8,289,299 B2 * | 10/2012 | Newton .................. G06F 3/042 |
| | | 178/18.09 |
| 8,316,324 B2 | 11/2012 | Boillot |
| 8,350,831 B2 | 1/2013 | Drumm |
| 8,426,799 B2 | 4/2013 | Drumm |
| 8,471,814 B2 | 6/2013 | LaFave et al. |
| 8,482,547 B2 | 7/2013 | Christiansson et al. |
| 8,508,505 B2 | 8/2013 | Shin et al. |
| 8,558,815 B2 | 10/2013 | Van Genechten et al. |
| 8,581,884 B2 | 11/2013 | Fahraeus et al. |
| 8,604,436 B1 | 12/2013 | Patel et al. |
| 8,648,677 B2 | 2/2014 | Su et al. |
| 8,922,340 B2 | 12/2014 | Salter et al. |
| 8,933,876 B2 | 1/2015 | Galor et al. |
| 9,050,943 B2 | 6/2015 | Muller |
| 9,207,800 B1 | 12/2015 | Eriksson et al. |
| 9,223,431 B2 | 12/2015 | Pemberton-Pigott |
| 10,282,034 B2 | 5/2019 | Eriksson et al. |
| 10,534,479 B2 | 1/2020 | Holmgren et al. |
| 11,842,014 B2 * | 12/2023 | Holmgren ............. G06F 3/0304 |
| 2001/0002694 A1 | 6/2001 | Nakazawa et al. |
| 2001/0022579 A1 | 9/2001 | Hirabayashi |
| 2001/0026268 A1 | 10/2001 | Ito |
| 2001/0028344 A1 | 10/2001 | Iwamoto et al. |
| 2001/0030642 A1 | 10/2001 | Sullivan et al. |
| 2001/0043189 A1 | 11/2001 | Brisebois et al. |
| 2001/0055006 A1 | 12/2001 | Sano et al. |
| 2002/0067348 A1 | 6/2002 | Masters et al. |
| 2002/0075243 A1 | 6/2002 | Newton |
| 2002/0103024 A1 | 8/2002 | Jeffway, Jr. et al. |
| 2002/0109843 A1 | 8/2002 | Ehsani et al. |
| 2002/0152010 A1 | 10/2002 | Colmenarez et al. |
| 2002/0175900 A1 | 11/2002 | Armstrong |
| 2003/0034439 A1 | 2/2003 | Reime et al. |
| 2003/0174125 A1 | 9/2003 | Torunoglu et al. |

(56) References Cited

U.S. PATENT DOCUMENTS

| | | |
|---|---|---|
| 2003/0231308 A1 | 12/2003 | Granger |
| 2003/0234346 A1 | 12/2003 | Kao |
| 2004/0031908 A1 | 2/2004 | Neveux et al. |
| 2004/0046960 A1 | 3/2004 | Wagner et al. |
| 2004/0056199 A1 | 3/2004 | OConnor et al. |
| 2004/0090428 A1 | 5/2004 | Crandall, Jr. et al. |
| 2004/0140961 A1 | 7/2004 | Cok |
| 2004/0198490 A1 | 10/2004 | Bansemer et al. |
| 2004/0201579 A1 | 10/2004 | Graham |
| 2005/0024623 A1 | 2/2005 | Xie et al. |
| 2005/0073508 A1 | 4/2005 | Pittel et al. |
| 2005/0093846 A1 | 5/2005 | Marcus et al. |
| 2005/0104860 A1 | 5/2005 | McCreary et al. |
| 2005/0122308 A1 | 6/2005 | Bell et al. |
| 2005/0133702 A1 | 6/2005 | Meyer |
| 2005/0174473 A1 | 8/2005 | Morgan et al. |
| 2005/0271319 A1 | 12/2005 | Graham |
| 2006/0001654 A1 | 1/2006 | Smits |
| 2006/0018586 A1 | 1/2006 | Kishida |
| 2006/0028455 A1 | 2/2006 | Hinckley et al. |
| 2006/0077186 A1 | 4/2006 | Park et al. |
| 2006/0132454 A1 | 6/2006 | Chen et al. |
| 2006/0161870 A1 | 7/2006 | Hotelling et al. |
| 2006/0161871 A1 | 7/2006 | Hotelling et al. |
| 2006/0229509 A1 | 10/2006 | Al-Ali et al. |
| 2006/0236262 A1 | 10/2006 | Bathiche et al. |
| 2006/0238517 A1 | 10/2006 | King et al. |
| 2006/0244733 A1 | 11/2006 | Geaghan |
| 2007/0024598 A1 | 2/2007 | Miller et al. |
| 2007/0052693 A1 | 3/2007 | Watari |
| 2007/0077541 A1 | 4/2007 | Champagne et al. |
| 2007/0084989 A1 | 4/2007 | Lange et al. |
| 2007/0103436 A1 | 5/2007 | Kong |
| 2007/0146318 A1 | 6/2007 | Juh et al. |
| 2007/0152984 A1 | 7/2007 | Ording et al. |
| 2007/0176908 A1 | 8/2007 | Lipman et al. |
| 2008/0008472 A1 | 1/2008 | Dress et al. |
| 2008/0012835 A1 | 1/2008 | Rimon et al. |
| 2008/0012850 A1 | 1/2008 | Keating III |
| 2008/0013913 A1 | 1/2008 | Lieberman et al. |
| 2008/0016511 A1 | 1/2008 | Hyder et al. |
| 2008/0055273 A1 | 3/2008 | Forstall |
| 2008/0056068 A1 | 3/2008 | Yeh et al. |
| 2008/0068353 A1 | 3/2008 | Lieberman et al. |
| 2008/0080811 A1 | 4/2008 | Deane |
| 2008/0089587 A1 | 4/2008 | Kim et al. |
| 2008/0093542 A1 | 4/2008 | Lieberman et al. |
| 2008/0096620 A1 | 4/2008 | Lee et al. |
| 2008/0100572 A1 | 5/2008 | Boillot |
| 2008/0100593 A1 | 5/2008 | Skillman et al. |
| 2008/0117183 A1 | 5/2008 | Yu et al. |
| 2008/0122792 A1 | 5/2008 | Izadi et al. |
| 2008/0122796 A1 | 5/2008 | Jobs et al. |
| 2008/0122803 A1 | 5/2008 | Izadi et al. |
| 2008/0134102 A1 | 6/2008 | Movold et al. |
| 2008/0158172 A1 | 7/2008 | Hotelling et al. |
| 2008/0158174 A1 | 7/2008 | Land et al. |
| 2008/0211779 A1 | 9/2008 | Pryor |
| 2008/0221711 A1 | 9/2008 | Trainer |
| 2008/0224836 A1 | 9/2008 | Pickering |
| 2008/0259053 A1 | 10/2008 | Newton |
| 2008/0273019 A1 | 11/2008 | Deane |
| 2008/0278460 A1 | 11/2008 | Arnett et al. |
| 2008/0297487 A1 | 12/2008 | Hotelling et al. |
| 2009/0009944 A1 | 1/2009 | Yukawa et al. |
| 2009/0027357 A1 | 1/2009 | Morrison |
| 2009/0058833 A1 | 3/2009 | Newton |
| 2009/0066673 A1 | 3/2009 | Molne et al. |
| 2009/0096994 A1 | 4/2009 | Smits |
| 2009/0102815 A1 | 4/2009 | Juni |
| 2009/0122027 A1 | 5/2009 | Newton |
| 2009/0135162 A1 | 5/2009 | Van De Wijdeven et al. |
| 2009/0139778 A1 | 6/2009 | Butler et al. |
| 2009/0153519 A1 | 6/2009 | Suarez Rovere |
| 2009/0166098 A1 | 7/2009 | Sunder |
| 2009/0167724 A1 | 7/2009 | Xuan et al. |
| 2009/0173730 A1 | 7/2009 | Baier et al. |
| 2009/0189857 A1 | 7/2009 | Benko et al. |
| 2009/0195402 A1 | 8/2009 | Izadi et al. |
| 2009/0198359 A1 | 8/2009 | Chaudhri |
| 2009/0280905 A1 | 11/2009 | Weisman et al. |
| 2009/0322673 A1 | 12/2009 | Cherradi El Fadili |
| 2010/0002291 A1 | 1/2010 | Fukuyama |
| 2010/0013763 A1 | 1/2010 | Futter et al. |
| 2010/0023895 A1 | 1/2010 | Benko et al. |
| 2010/0031203 A1 | 2/2010 | Morris et al. |
| 2010/0066975 A1 | 3/2010 | Rehnstrom |
| 2010/0079407 A1 | 4/2010 | Suggs |
| 2010/0079409 A1 | 4/2010 | Sirotich et al. |
| 2010/0079412 A1 | 4/2010 | Chiang et al. |
| 2010/0095234 A1 | 4/2010 | Lane et al. |
| 2010/0134424 A1 | 6/2010 | Brisebois et al. |
| 2010/0149073 A1 | 6/2010 | Chaum et al. |
| 2010/0185341 A1 | 7/2010 | Wilson et al. |
| 2010/0208234 A1 | 8/2010 | Kaehler |
| 2010/0238138 A1 | 9/2010 | Goertz et al. |
| 2010/0238139 A1 | 9/2010 | Goertz et al. |
| 2010/0245289 A1* | 9/2010 | Svajda .................. G06F 3/0421 |
| | | 345/175 |
| 2010/0289755 A1 | 11/2010 | Zhu et al. |
| 2010/0295821 A1 | 11/2010 | Chang et al. |
| 2010/0299642 A1 | 11/2010 | Merrell et al. |
| 2010/0302185 A1 | 12/2010 | Han et al. |
| 2010/0321289 A1 | 12/2010 | Kim et al. |
| 2011/0005367 A1 | 1/2011 | Hwang et al. |
| 2011/0043325 A1 | 2/2011 | Newman et al. |
| 2011/0043826 A1 | 2/2011 | Kiyose |
| 2011/0044579 A1 | 2/2011 | Travis et al. |
| 2011/0050639 A1 | 3/2011 | Challener et al. |
| 2011/0050650 A1 | 3/2011 | McGibney et al. |
| 2011/0057906 A1 | 3/2011 | Raynor et al. |
| 2011/0063214 A1 | 3/2011 | Knapp |
| 2011/0074734 A1 | 3/2011 | Wassvik et al. |
| 2011/0074736 A1 | 3/2011 | Takakura |
| 2011/0075418 A1 | 3/2011 | Mallory et al. |
| 2011/0087963 A1 | 4/2011 | Brisebois et al. |
| 2011/0090176 A1 | 4/2011 | Christiansson et al. |
| 2011/0116104 A1 | 5/2011 | Kao et al. |
| 2011/0121182 A1 | 5/2011 | Wong et al. |
| 2011/0122560 A1 | 5/2011 | Andre et al. |
| 2011/0128234 A1 | 6/2011 | Lipman et al. |
| 2011/0128729 A1 | 6/2011 | Ng |
| 2011/0148820 A1 | 6/2011 | Song |
| 2011/0157097 A1 | 6/2011 | Hamada et al. |
| 2011/0163956 A1 | 7/2011 | Zdralek |
| 2011/0163996 A1 | 7/2011 | Wassvik et al. |
| 2011/0169773 A1 | 7/2011 | Luo |
| 2011/0169780 A1 | 7/2011 | Goertz et al. |
| 2011/0169781 A1 | 7/2011 | Goertz et al. |
| 2011/0175533 A1 | 7/2011 | Holman et al. |
| 2011/0175852 A1 | 7/2011 | Goertz et al. |
| 2011/0179368 A1 | 7/2011 | King et al. |
| 2011/0179381 A1 | 7/2011 | King |
| 2011/0205175 A1 | 8/2011 | Chen |
| 2011/0205186 A1 | 8/2011 | Newton et al. |
| 2011/0221706 A1 | 9/2011 | McGibney et al. |
| 2011/0227487 A1 | 9/2011 | Nichol et al. |
| 2011/0227874 A1 | 9/2011 | Fahraeus et al. |
| 2011/0242056 A1 | 10/2011 | Lee et al. |
| 2011/0248151 A1* | 10/2011 | Holcombe ............... G01S 17/46 |
| | | 250/221 |
| 2011/0249309 A1 | 10/2011 | McPheters et al. |
| 2011/0309912 A1 | 12/2011 | Muller |
| 2011/0310005 A1 | 12/2011 | Chen et al. |
| 2012/0050226 A1 | 3/2012 | Kato |
| 2012/0056821 A1 | 3/2012 | Goh |
| 2012/0068971 A1 | 3/2012 | Pemberton-Pigott |
| 2012/0068973 A1* | 3/2012 | Christiansson ....... G06F 3/0421 |
| | | 345/175 |
| 2012/0071994 A1 | 3/2012 | Lengeling |
| 2012/0086672 A1 | 4/2012 | Tseng et al. |
| 2012/0098746 A1 | 4/2012 | Ogawa |
| 2012/0098753 A1 | 4/2012 | Lu |
| 2012/0098794 A1 | 4/2012 | Kleinert et al. |

(56) References Cited

U.S. PATENT DOCUMENTS

| | | | |
|---|---|---|---|
| 2012/0116548 A1 | 5/2012 | Goree et al. | |
| 2012/0127317 A1 | 5/2012 | Yantek et al. | |
| 2012/0131186 A1 | 5/2012 | Klos et al. | |
| 2012/0133956 A1 | 5/2012 | Findlay et al. | |
| 2012/0162078 A1 | 6/2012 | Ferren et al. | |
| 2012/0176343 A1 | 7/2012 | Holmgren et al. | |
| 2012/0188203 A1 | 7/2012 | Yao et al. | |
| 2012/0188205 A1 | 7/2012 | Jansson et al. | |
| 2012/0212457 A1 | 8/2012 | Drumm | |
| 2012/0212458 A1 | 8/2012 | Drumm | |
| 2012/0218229 A1 | 8/2012 | Drumm | |
| 2012/0223231 A1 | 9/2012 | Nijaguna | |
| 2012/0262408 A1 | 10/2012 | Pasquero et al. | |
| 2012/0306793 A1 | 12/2012 | Liu et al. | |
| 2013/0044071 A1 | 2/2013 | Hu et al. | |
| 2013/0057594 A1 | 3/2013 | Pryor | |
| 2013/0127788 A1 | 5/2013 | Drumm | |
| 2013/0127790 A1 | 5/2013 | Wassvik | |
| 2013/0135259 A1 | 5/2013 | King et al. | |
| 2013/0141395 A1 | 6/2013 | Holmgren et al. | |
| 2013/0215034 A1 | 8/2013 | Oh et al. | |
| 2013/0234171 A1 | 9/2013 | Heikkinen et al. | |
| 2013/0263633 A1 | 10/2013 | Minter et al. | |
| 2014/0049516 A1 | 2/2014 | Heikkinen et al. | |
| 2014/0069015 A1 | 3/2014 | Salter et al. | |
| 2014/0104160 A1 | 4/2014 | Eriksson et al. | |
| 2014/0104240 A1 | 4/2014 | Eriksson et al. | |
| 2014/0213323 A1 | 7/2014 | Holenarsipur et al. | |
| 2014/0291703 A1 | 10/2014 | Rudmann et al. | |
| 2014/0292665 A1 | 10/2014 | Lathrop et al. | |
| 2014/0293226 A1 | 10/2014 | Hainzl et al. | |
| 2014/0320459 A1 | 10/2014 | Pettersson et al. | |
| 2014/0362206 A1 | 12/2014 | Kossin | |
| 2015/0015481 A1 | 1/2015 | Li | |
| 2015/0153777 A1 | 6/2015 | Liu et al. | |
| 2015/0185945 A1 | 7/2015 | Lauber | |
| 2015/0227213 A1 | 8/2015 | Cho | |
| 2015/0248796 A1* | 9/2015 | Iyer | G06F 3/0428 |
| | | | 340/5.61 |
| 2016/0026250 A1* | 1/2016 | Eriksson | G06F 3/0421 |
| | | | 345/175 |
| 2016/0067602 A1 | 3/2016 | Holmgren et al. | |
| 2016/0154475 A1 | 6/2016 | Eriksson et al. | |
| 2016/0154533 A1 | 6/2016 | Eriksson et al. | |
| 2017/0115825 A1 | 4/2017 | Eriksson et al. | |
| 2017/0160427 A1 | 6/2017 | Costello et al. | |
| 2017/0185160 A1 | 6/2017 | Cho et al. | |
| 2017/0262134 A1 | 9/2017 | Eriksson et al. | |
| 2017/0315654 A1 | 11/2017 | Kim | |
| 2018/0045827 A1 | 2/2018 | Yoon et al. | |
| 2018/0120892 A1* | 5/2018 | von Badinski | A61B 5/6806 |
| 2018/0267216 A1 | 9/2018 | Otsubo | |
| 2020/0001556 A1 | 1/2020 | Otsubo | |
| 2020/0319720 A1 | 10/2020 | Murayama et al. | |

FOREIGN PATENT DOCUMENTS

| | | | |
|---|---|---|---|
| EP | 1906632 A2 | | 4/2008 |
| JP | 10-148640 A | | 6/1998 |
| JP | 11-232024 A | | 8/1999 |
| JP | 3240941 B2 | | 12/2001 |
| JP | 2003-029906 A | | 1/2003 |
| JP | 2013-149228 A | | 8/2013 |
| JP | 2014183396 A | * | 9/2014 |
| JP | 2019074933 A | | 5/2019 |
| KR | 1020120120097 A | | 11/2012 |
| KR | 1012682090000 B1 | | 5/2013 |
| KR | 1020130053363 A | | 5/2013 |
| KR | 1020130053364 A | | 5/2013 |
| KR | 1020130053367 A | | 5/2013 |
| KR | 1020130053377 A | | 5/2013 |
| KR | 1020130054135 A | | 5/2013 |
| KR | 1020130054150 A | | 5/2013 |
| KR | 1020130133117 A | | 12/2013 |
| KR | 1020160009073 A | | 1/2016 |
| KR | 1020170105536 A | | 9/2017 |
| WO | 86/00446 A1 | | 1/1986 |
| WO | 86/00447 A1 | | 1/1986 |
| WO | 2008/004103 A2 | | 1/2008 |
| WO | 2008/133941 A2 | | 11/2008 |
| WO | 2010/011929 A1 | | 1/2010 |
| WO | 2010/015408 A1 | | 2/2010 |
| WO | 2010/134865 A1 | | 11/2010 |
| WO | 2012/017183 A1 | | 2/2012 |
| WO | 2012/089957 A1 | | 7/2012 |
| WO | 2012/089958 A1 | | 7/2012 |
| WO | 2013/102551 A1 | | 7/2013 |
| WO | 2014/041245 A1 | | 3/2014 |
| WO | 2014194151 A2 | | 12/2014 |
| WO | 2015/161070 A2 | | 10/2015 |
| WO | 2016/048590 A1 | | 3/2016 |
| WO | 2016122927 A1 | | 8/2016 |
| WO | 2018/216619 A1 | | 11/2018 |

OTHER PUBLICATIONS

EP Search Report for Publication EP20910203, Dec. 15, 2023. 10 pages.

Hodges, S., Izadi, S., Butler, A., Rrustemi A., Buxton, B., "ThinSight: Versatile Multitouch Sensing for Thin Form-Factor Displays." UIST'07, Oct. 7-10, 2007. <http://www.hci.iastate.edu/REU09/pub/main/telerobotics_team_papers/thinsight_versatile_multitouch_sensing_for_thin_formfactor_displays.pdf>.

Miyamoto, I., et al., Basic Study of Touchless Human Interface Using Net Structure Proximity Sensors, Journal of Robotics and Mechatronics vol. 25 No.3, 2013, pp. 553-558.

Miyamoto, I., et al., Basic Study of Touchless Human Interface Using Net Structure Proximity Sensors, No. 12-3 Proceedings of the 2012 JSME Conference on Robotics and Mechanics, Hamamatsu, Japan, May 27-29, 2012, 2P1-P03(1) to 2P1-P03(3).

Moeller, J. et al., ZeroTouch: An Optical Multi-Touch and Free-Air Interaction Architecture, Proc. CHI 2012 Proceedings of the 2012 Annual Conference Extended Abstracts on Human Factors in Computing Systems, May 5, 2012, pp. 2165-2174. ACM New York, NY, USA.

Moeller, J. et al., Zero Touch: A Zero-Thickness Optical Multi-Touch Force Field, CHI EA '11 Proceedings of the 2011 Annual Conference Extended Abstracts on Human Factors in Computing Systems, May 2011, pp. 1165-1170. ACM New York, NY, USA.

Moeller, J. et al., IntangibleCanvas: Free-Air Finger Painting on a Projected Canvas, CHI EA '11 Proceedings of the 2011 Annual Conference Extended Abstracts on Human Factors in Computing Systems, May 2011, pp. 1615-1620. ACM New York, NY, USA.

Moeller, J. et al., Scanning FTIR: Unobtrusive Optoelectronic Multi-Touch Sensing through Waveguide Transmissivity Imaging,TEI '10 Proceedings of the Fourth International Conference on Tangible, Embedded, and Embodied Interaction, Jan. 2010, pp. 73-76. ACM New York, NY, USA.

Plaisant, C., Wallace, D. (1992): Touchscreen Toggle Design. In: Bauersfeld, Penny, Bennett, John, Lynch, Gene (eds.) Proceedings of the ACM CHI 92 Human Factors in Computing Systems Conference Jun. 3-7, 1992, Monterey, California. pp. 667-668.

Van Loenen, Evert, et al., Entertaible: A Solution for Social Gaming Experiences, Tangible Play Workshop, Jan. 28, 2007, pp. 16-19, Tangible Play Research and Design for Tangible and Tabletop Games, Workshop at the 2007 Intelligent User Interfaces Conference, Workshop Proceedings.

Butler et al., "SideSight: Multi-touch Interaction Around Smart Devices." UIST'08, Oct. 2008. http://131.107.65.14/en-us/um/people/shahrami/papers/sidesight.pdf.

Johnson, M., "Enhanced Optical Touch Input Panel", IBM Technical Disclosure Bulletin vol. 28, No. 4, Sep. 1985 pp. 1760-1762.

Rakkolainen, I., Höllerer, T., Diverdi, S. et al., Mid-air display experiments to create novel user interfaces, Multimed. Tools Appl. (2009) 44: 389, doi: 10.1007/s11042-009-0280-1.

Hasegawa, K. et al., SIGGRAPH '15, ACM, SIGGRAPH 2015 Emerging Technologies, Article 18, Jul. 31, 2015, ACM, New York, NY, USA, ISBN: 978-1-4503-3635-2, doi: 10.1145/2782782.2785589.

(56) References Cited

OTHER PUBLICATIONS

U.S. Appl. No. 14/312,787, Non-final Office Action, mailed on Jan. 8, 2015, 15 pages.
U.S. Appl. No. 14/312,787, Notice of Allowance, mailed on Jun. 22, 2015, 9 pages.
PCT Application No. PCT/US2014/040112, International Preliminary Report on Patentability, mailed on Dec. 1, 2015, 18 pages.
PCT Application No. PCT/US2014/040112, Search Report and Written Opinion, mailed on Dec. 2, 2014, 21 pages.
European Patent Application No. 14 804 520.6, Extended European Search Report, mailed on May 24, 2016, 11 pages.
European Patent Application No. 14 804 520.6, First Office Action, mailed on May 10, 2017, 9 pages.
Chinese Patent Application No. 201480030571.8, First Office Action, mailed on Aug. 16, 2016, 6 pages.
Chinese Patent Application No. 201480030571.8, Second Office Action, rmailed on May 4, 2017, 4 pages.
U.S. Appl. No. 14/555,731, mailed on Dec. 2, 2016, 8 pages.
PCT Application No. PCT/US2015/057460, International Search Report, mailed on Jan. 21, 2016, 2 pages.
PCT Application No. PCT/US2015/057460, Written Opinion, mailed on Jan. 21, 2016, 6 pages.
U.S. Appl. No. 15/000,815, Non-final Office Action, mailed on Jun. 3, 2016, 7 pages.
U.S. Appl. No. 15/000,815, Final Office Action, mailed on Jan. 23, 2017, 8 pages.
PCT Application No. PCT/US2016/013927, International Search Report and Written Opinion, mailed on May 26, 2016, 13 pages.
European Patent Application No. 16743860.5, Extended European Search Report, mailed on Jul. 18, 2018, 8 pages.
Japanese Patent Appliation No. 2017-539236, First Office Action, mailed on Sep. 10, 2018, 3 pages.
U.S. Appl. No. 15/616,106, Non-Final Office Action, mailed on Mar. 7, 2019, 10 pages.
U.S. Appl. No. 15/898,585, Non-Fnal Office Action, mailed on Sep. 13, 2018, 9 pages.
U.S. Appl. No. 15/990,587, Notice of Allowance, mailed on Sep. 4, 2019, 8 pages.
U.S. Appl. No. 16/127,238, Non-fFnal Office Action. mailed on Mar. 5, 2020, 18 pages.
U.S. Appl. No. 16/365,662, Non-Final Office Action, mailed on Aug. 21, 2020, 9 pages.
U.S. Appl. No. 16/365,662, Notice of Allowance, mailed on Nov. 20, 2020, 10 pages.
U.S. Appl. No. 16/694,018, Non-Final Office Action, mailed on Apr. 7, 2020, 9 pages.
U.S. Appl. No. 16/739,142, Notice of Allowance, mailed on Apr. 28, 2021, 8 pages.
PCT Application No. PCT/US2020/06599, Search Report and Written Opinion, mailed on May 3, 2021, 14 pages.
U.S. Appl. No. 17/198,273, Notice of Allowance, mailed on Aug. 9, 2022, 10 pages.
U.S. Appl. No. 17/385,260, Non-final Office action, mailed on Aug. 16, 2022, 11 pages.
JP 2019-074933 A, Machine Translation.
JP 2017-199336 A, Abstract.
JP 2019-07493 A, Abstract.
EPO Translation for KR Publication No. 1020160009073A.
EPO Translation for KR Publication No. 1020170105536A.
Office Action for corresponding KR Publication No. 1020227020629A, Jun. 19, 2024.
English Translation of Office Action for corresponding KR Publication No. 1020227020629A, Jun. 19, 2024.

\* cited by examiner

CONTACTLESS TOUCH INPUT SYSTEM

FIELD OF THE INVENTION

The field of the present invention is proximity sensors used in connection with indicia or a display screen to enable a contactless input system. Applications of the present invention include, inter alia, vending machines, interactive kiosks, self-checkout terminals, automatic teller machines (ATMs) and elevator button panels. The proximity sensors of the present invention are also intended for rugged environments, including sensors in and around vehicles, automatic doors for vehicles and buildings, and sensors, inter alia in mobile phones, tablets and vehicle cabins, for detecting in-air hand gestures and approaching persons and objects.

BACKGROUND OF THE INVENTION

Certain proximity sensors provide high-resolution detection of an object's location within a detection plane. Such proximity sensors are employed inter alia as sensors for touchscreens. Other proximity sensors provide only rudimentary object detection, such as parking sensors. It would be advantageous to optimize proximity sensor cost and performance for a range of applications that fall between these two extremes; namely, applications that do not require detection of an object's precise location within a detection zone, but rather, require detection of activity occurring within a zone, e.g., detection of in-air gestures.

Certain proximity sensors employed as sensors for touchscreens need to be extended along an entire edge of the screen, and limitations in automated assembly equipment may limit the maximum length of a sensor, or else result in high manufacturing cost when manufacturing long sensors for large screens. It would be advantageous to enable using multiple, small sensors to provide touch detection for larger screen sizes.

The COVID-19 pandemic of 2019-2020 generated interest in contactless user interfaces for touchscreens, buttons and knobs, without requiring the user to touch the screen, button or knob, particularly for public terminals, such as automated teller machines (ATMs), self-checkout terminals in supermarkets, self-check-in terminals at airports, elevator button panels and vending machines. Contactless user interfaces for touchscreens, buttons and knobs also useful for sterile environments, such as doctors' offices and hospitals, and also for environments where people tend to have greasy or otherwise soiled hands, such as vehicle repair shops.

Another application of contactless user interfaces is automatic opening and closing mechanisms for car and elevator doors and liftgates. These doors and liftgates require supervision to prevent the moving door or liftgate panel from colliding with a nearby object, such as a curb, a tree or a neighboring parked car. It would be advantageous to provide higher resolution than today's rudimentary parking sensors for detecting objects that a moving door or liftgate panel is approaching.

Electromechanical systems need to be protected, particularly from moisture, without hindering the system's operation.

SUMMARY

Embodiments of the present invention provide low-cost optics for a proximity sensor that is highly accurate with respect to its intended uses and further enables low cost assembly practices to be used in the manufacture of the sensor. The sensor is an improvement in terms of cost and manufacturing realized by employing an extruded plastic lens to collimate light in a first dimension, and a Fresnel lens array to collimate light in a second dimension. Part of the novelty lies in realizing that sensors intended for gesture detection are far more tolerant of systematic errors than sensors intended for detecting absolute coordinates of an object.

There is thus provided in accordance with an embodiment of the present invention a proximity sensor including a circuit board, at least one lens, a support structure suspending the at least one lens above the circuit board, a plurality of light emitters mounted on the circuit board, each emitter operable when activated to project light beams through the at least one lens along a common projection plane, a plurality of light detectors mounted on the circuit board, each detector operable when activated to detect amounts of light arriving through the at least one lens at the detector, wherein a reflective object located in the projection plane above the at least one lens reflects light projected at the reflective object from an emitter to one or more of the detectors, and wherein each emitter-detector pair, including one of the emitters and one of the detectors, when synchronously activated, is expected to generate a greater detection signal at the activated detector than the other detectors, were they also to be synchronously activated with any of the emitters, when the reflective object is located at a specific 2D location in the projection plane corresponding to the emitter-detector pair, and a processor connected to the emitters and to the detectors, configured to sequentially activate each emitter and synchronously co-activate one or more of the detectors, and to identify gestures performed by the reflective object above the at least one lens, based on amounts of light detected by the detector of each synchronously activated emitter-detector pair.

There is additionally provided in accordance with an embodiment of the present invention a proximity sensor including a circuit board, at least one lens, a support structure suspending the at least one lens above the circuit board, a plurality of light emitters mounted on the circuit board and arranged along a first planar curve, each emitter operable when activated to project light beams through the at least one lens through a detection volume, a plurality of light detectors mounted on the circuit board and arranged along a second planar curve, each detector operable when activated to detect amounts of light arriving through the at least one lens at the detector, wherein a reflective object located in the detection volume above the at least one lens reflects light projected at the reflective object from an emitter to one or more of the detectors, and wherein each emitter-detector pair, including one of the emitters and one of the detectors, when synchronously activated, is expected to generate a greater detection signal at the activated detector than the other detectors, were they also to be synchronously activated with any of the emitters, when the reflective object is located at a specific 3D location in the detection volume corresponding to the emitter-detector pair, and a processor connected to the emitters and to the detectors, configured to sequentially activate each emitter and synchronously co-activate one or more of the detectors, and to identify gestures performed by the reflective object above the at least one lens, based on amounts of light detected by the detector of each synchronously activated emitter-detector pair.

Prior art proximity sensors formed as an elongated strip mounted along an edge of a detection area, designed for detecting absolute coordinates of an object, require precision assembly equipment. It is presently costly and inefficient to manufacture these proximity sensors suitable for screens whose edges are longer than 350 mm. Embodiments of the present invention are therefore also directed at enabling the use of prior art proximity sensors for screens whose edges are longer than 350 mm, by using multiple sensors, each sensor being operative to detect objects in a portion of the display area. Embodiments of the present invention are also applicable to the low-cost sensors discussed above.

There is thus further provided, in accordance with an embodiment of the present invention a user interface device including a display, a computer rendering a user interface on the display and operable to respond to touch gestures reported as having occurred at locations on the display, a pair of sensors mounted along opposite edges of the display, each sensor including a plurality of light emitters operable to project light beams in a plane above and across an upper surface of the display, wherein locations in the plane correspond to locations within the display, a plurality of light detectors operable to detect amounts of the projected light beams reflected by an object inserted into the plane, and a control unit operable to simultaneously activate individual ones of the emitters and the detectors, and to calculate a location of the object in the plane based on outputs from the detectors, and a processor receiving the calculated object locations from the sensors, and configured to remove object locations, received from one of the pair of sensors, that were generated by detection of light emitted by the other of the pair of sensors, calculate an output location based on a weighted sum of the non-removed object locations, temporally filter the output location based on previous output locations, and report the temporally filtered output location as a touch location on the display to the computer.

Embodiments of the present invention are also directed at enabling intuitive graphical user interfaces (GUIs) intended for use by a finger hovering above the display on which the GUI is presented, and not touching the display. In this case, due to parallax effects, the user is unsure how the hovering finger is mapped onto the GUI.

There is thus yet further provided, in accordance with an embodiment of the present invention a contactless user interface system, including a display rendering a plurality of graphical user interface (GUI) elements at locations within the display, a sensor configured to identify coordinates within a detection plane, above and across the display, of an object inserted into the detection plane, wherein coordinates within the detection plane correspond to locations within the display, and a processor causing the display to render a cursor when the coordinates within the detection plane, identified by the sensor, do not correspond to locations within the display where any of the GUI elements are located, and to erase the rendered cursor when the coordinates within the detection plane, identified by the sensor, correspond to locations within the display where any of the GUI elements are located.

BRIEF DESCRIPTION OF THE DRAWINGS

The present invention will be more fully understood and appreciated from the following detailed description, taken in conjunction with the drawings in which.

In the disclosure and figures, the following numbering scheme is used. Like numbered elements are similar but not necessarily identical.

TABLE I

Elements of Figures

| Type of element | Numbering range | FIGS. |
|---|---|---|
| light detector | 100-119 | 1-5, 17, 18, 21, 22 |
| light emitter and light detector | 120, 121 | 14 |
| two light detectors and a light emitter between them | 130 | 14 |
| light emitter | 150-167 | 1-5, 17, 18, 21, 22 |
| light beam | 200-207, 212 | 1-5, 17, 18, 21, 22 |
| light beams | 210, 211 | 6, 8, 10, 19 |
| corridor of maximum detection for a reflected light beam | 250-262 | 1, 3-6, 8, 10, 17, 18, 21, 22 |
| detection light field | 270-272 | 28-30, 32 |
| processor | 300 | 1, 14 |
| PCB | 301, 303 | 6-11, 13, 14, 16-18 |
| I2C connector | 304, 305 | 14, 16 |
| communication bus | 308 | 16 |
| wireless trackpad | 310 | 19, 20A, 20B |
| battery | 311 | 20B |
| wireless communication chip | 312 | 20B |
| housing | 313 | 19, 20A, 20B |
| sensor hardware | 315, 316 | 28-30, 32 |
| hotspot | 350, 354-359 | 1, 3-5 |
| proximity sensor | 351-353, 384-388 | 1, 15, 20B, 23-26 |
| undetected zone | 360, 361 | 5, 7, 11 |
| support structure | 364 | 13, 17, 18 |
| detection image | 365, 367, 369 | 12 |
| detection correlation | 366, 368, 370 | 12 |
| detection zone | 375, 376 | 15 |
| array of hotspots | 377-383 | 7, 9, 11, 21, 22 |
| lens | 400-402 | 1, 2 |
| lens array | 405, 409, 411 | 1, 3-11, 13 |
| cylindrical lens | 410 | 13, 17, 18 |
| Fresnel lens | 412-414 | 13, 17, 18 |
| display | 501, 504 | 23-25 |
| user | 502 | 23 |
| detection plane | 503, 505-510 | 23-25 |
| finger | 512 | 29, 30, 32 |
| display | 514 | 30-32 |
| GUI element | 515-518 | 31, 32 |
| processor | 520 | 24-26, 32 |
| computer | 521 | 24-26 |
| elements in a computer program | 1001-1010 | 26 |
| states in a state machine | 1021-1026 | 27 |
| operation in a flowchart | 1030-1047 | 33, 34 |

DETAILED DESCRIPTION

In the present description and claims, the term "gesture" includes pointing gestures, such as tapping on an icon in a touchscreen user interface. In the context of in-air gestures, the term "gesture" includes both, pointing at a location and also jabbing a location, which is similar to a tap gesture in-air, namely, a pointer is inserted into an in-air detection plane at a location in the plane, and removed from the detection plane at the same location.

Figure 1:
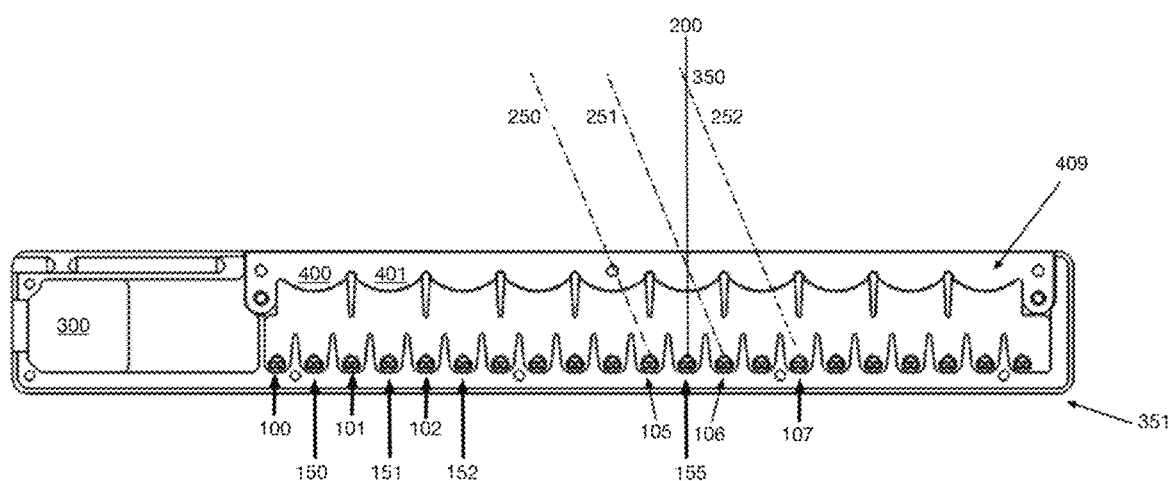
FIG. 1 is a simplified illustration of a first proximity sensor, in accordance with an embodiment of the present invention.

Reference is made to FIG. 1, which is a simplified illustration of a first proximity sensor, in accordance with an embodiment of the present invention. FIG. 1 shows a proximity sensor 351, that includes a one-dimensional array of alternating light emitters (150, 151, 152, 155) and light detectors (100, 101, 102, 105, 106, 107) and an array 409 of lenses (400, 401), wherein each lens is positioned opposite a respective one of the emitters to direct light from the emitter as a beam 200 into a detection plane outside sensor 351. Each lens also serves to maximize light detection at a respective first one of the detectors when light enters the lens at a first particular angle. This is a first viewing angle for each detector. In FIG. 1 three viewing angles 250-252 are shown, for three detectors 105-107, respectively. Maximal detection occurs when an object is inserted into the path of a projected light beam at a location 350 and reflects light back at one of the detectors at the detector's viewing angle. This location in the detection plane is referred to as a hotspot. Processor 300 controls activation of emitter-detector pairs and processes the detector outputs to identify object locations in the detection plane.

The proximity sensor illustrated in FIG. 1 is not ideally suited for all applications, as it is designed for touch detection applications, namely, for identifying, with high-precision, the location of an object in the detection plane. This touch-detection objective requires high-precision optics and process-intensive software to filter and refine the detected optical signals. However, a sensor designed to detect movement gestures within a detection zone rather than the location of an object within a plane, has very different hardware and software characteristics.

Sensors for detecting movement gestures are suitable inter alia for detecting in-air hand gestures. This is a different type of user interface than a touchscreen, as a gesture is defined by relative positioning; namely, how an object moves while performing the gesture, rather than absolute positioning used for touchscreens; namely, where the object is located within a defined area. Another suitable application is vehicle liftgate mechanisms that open a liftgate in the rear of a vehicle in response to a user waving a hand opposite the liftgate or sliding a foot underneath the vehicle. Movement gesture sensors are also useful for collision avoidance systems. For example, a sensor along an automatic door detects objects that the door is approaching as the door opens, and sends a command to halt the door's movement before the door collides with the object. If the sensor can report characteristics of an approaching object, such as size and shape, the door may be selectively halted according to the type of object, e.g., a curb or wall may be treated differently than a bush or hedge, which may be treated differently than a person.

According to the teachings of the present invention a low-cost, robust and automotive-compliant hand gesture sensor incorporates the following features:
- modular optics, such as Fresnel lenses, extruded lenses and/or injection molded lenses;
- joining the lenses to the sensor housing using heat staking, also known as thermoplastic staking;
- standard FR-4 glass epoxy PCB;
- ARM® processor (ARM is a registered trademark of Arm Limited);
- standard, surface-mount device (SMD) VCSELs and PDs; and
- standard soldering processes.

TABLE II below lists some design characteristics, that dictate corresponding geometric parameters, for an embodiment of the gesture sensor according to the teachings of the present invention.

TABLE II

Design Characteristics

| Motivation | Parameter |
| --- | --- |
| Sensor must be larger than a typical human hand | Width >200 mm |
| Detect coarse hand wave gestures | Reach: 250 mm-400 mm |
| A hand should be detected by at least three emitter-detector pairs | Pitch 20 mm-25 mm |
| Robust in terms of signal levels | Bezel >5 mm |
| Capture any hand size | Minimal object size >40 mm |
| Portrait mode is desirable | Aspect ratio ~2:3 (18.3°, portrait mode) |
| Compact size | Cross section ~12 mm × 20 mm |

The parameters in Table II are illustrative for a sensor designed for detecting hand gestures. Other embodiments of the invention will have different pitches and other parameters. For example, if more powerful lasers and photodiodes are used, the cross section is significantly smaller. Similarly, reducing the detection range reduces the sensor dimensions.

Figure 2:
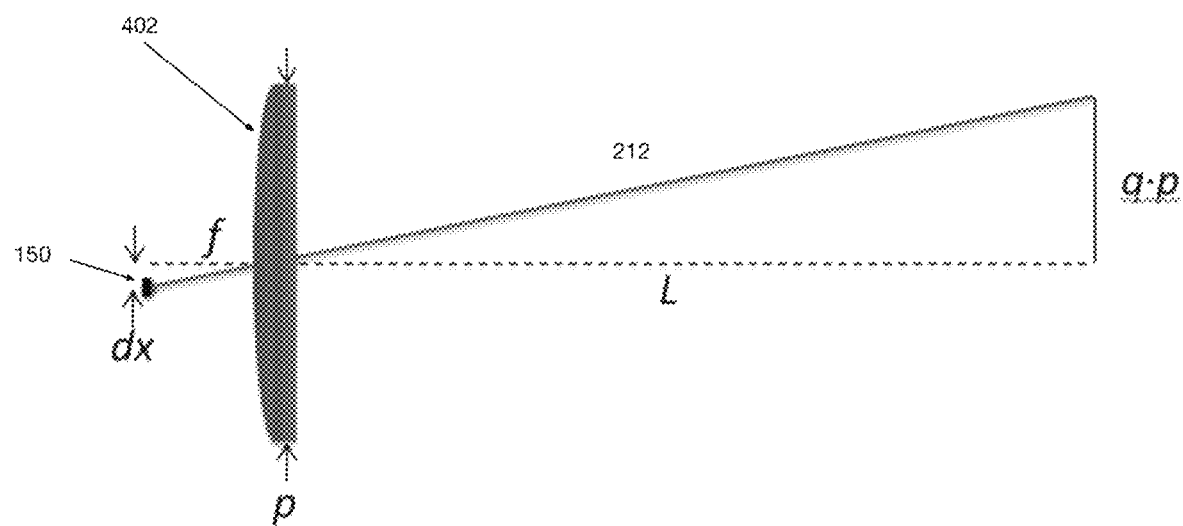
FIG. 2 is an illustration of geometric parameters for proximity sensors, in accordance with an embodiment of the present invention.

Reference is made to FIG. 2, which is an illustration of geometric parameters for proximity sensors, in accordance with an embodiment of the present invention. FIG. 2 shows the geometry for determining the maximum sideways tolerance (dx) between optics and VCSEL in a sensor. An emitter 150 is shown shifted from its correct position opposite lens 402. This displacement causes emitter beam 212 to skew away from its expected path along the dashed horizontal line. TABLE III below summarizes the parameters shown in FIG. 2, for a touch sensor and for a gesture sensor.

TABLE III

Parameters shown in FIG. 2

| Parameter | Symbol | Touch sensor | Gesture sensor |
| --- | --- | --- | --- |
| Focal length | f | 3.5 mm | 15 mm |
| Reach | L | 228 mm | 400 mm |
| Pitch | P | 7.2 mm | 21.6 mm |
| Part of pitch | q | 0.25 | 0.4 |
| maximum sideways tolerance between optics and VCSEL | dx | 0.027 mm | 0.32 mm |

As shown in FIG. 2, dx is calculated by $$dx = \frac{qpf}{L}.$$

TABLE III indicates that the maximum sideways tolerance for a hand-wave-gesture sensor (0.32 mm) is greater than the tolerance for a touch sensor by a factor of ten, making it feasible to use a standard soldering process to solder SMD components in a hand-wave-gesture sensor. The tolerance in Table III refers to random errors. However, tolerances for systematic errors, e.g., resulting in a skewed detection area, are much greater. The hand-wave-gesture sensor is also suitable for use as a touch sensor for user interfaces in which a user activates icons or buttons, in particular, when the icons or buttons are large and/or where the icons or button are arranged with large amounts of space between them, as such user interfaces have a high tolerance for error in the detected touch coordinates.

Figure 3:
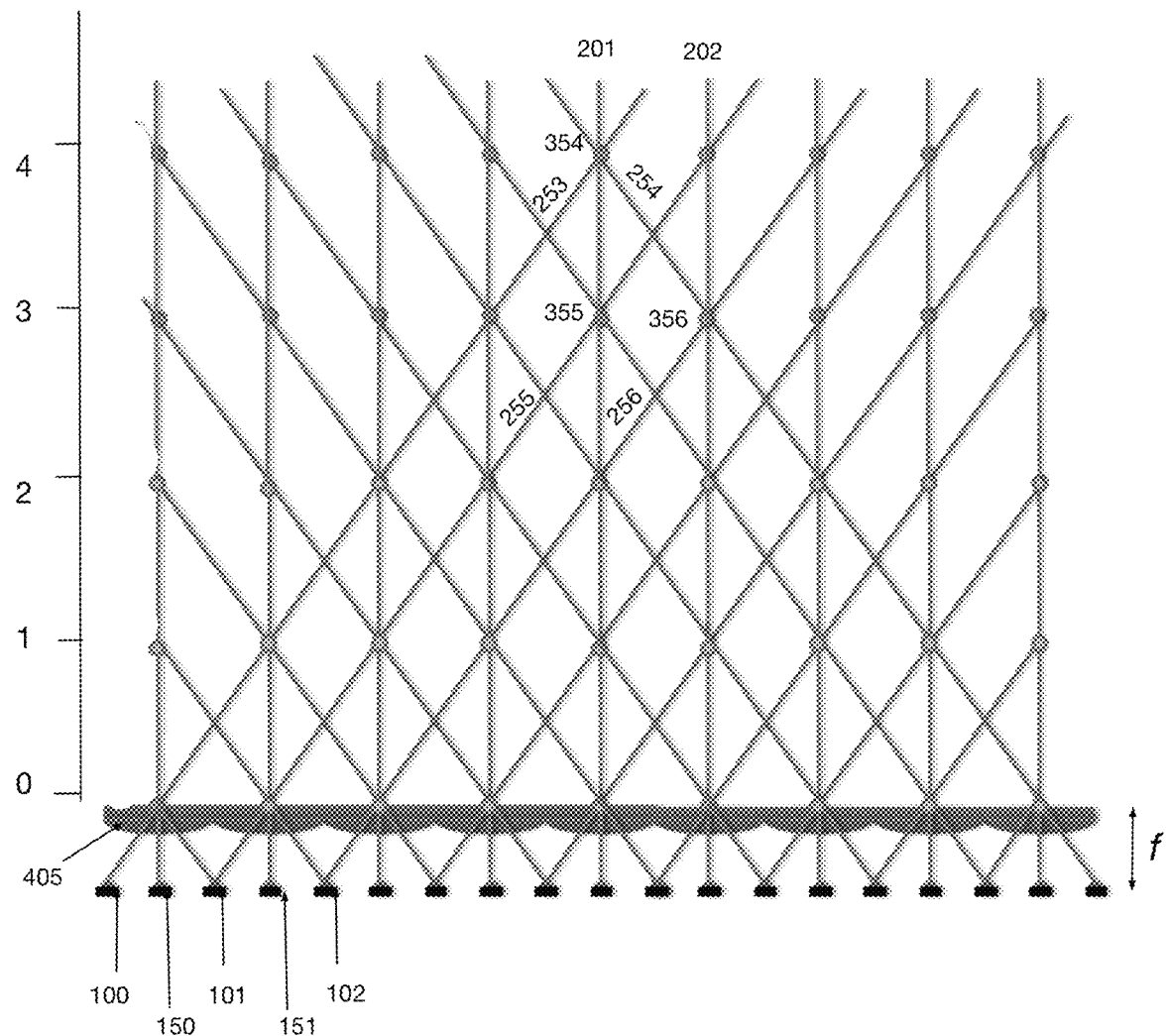
FIG. 3 is an illustration of a sensor and a rectangular grid of hotspots in the sensor detection area, in accordance with an embodiment of the present invention.

Reference is made to FIG. 3, which is an illustration of a sensor and a rectangular grid of hotspots in the sensor detection area, in accordance with an embodiment of the present invention. FIG. 3 illustrates a gesture sensor based on the design shown in FIG. 1, in which each detector receives maximum light detection from two neighboring lenses. Certain elements in FIG. 3 are numbered. They are emitters 150 and 151, detectors 100-102, emitter light beams 200 and 201, corridors of maximum detection 253-256, hotspots 354-356, and array of lenses 405. As discussed hereinabove, hotspots are at the intersection of an emitter beam and a corridor of maximum detection. FIG. 3 shows four rows of hotspots 1-4 in the detection plane outside the sensor, and an additional row of hotspots (row 0) adjacent to lenses 405. Assuming a gesture sensor in which the distance between emitters (the pitch) is 21.6 mm, and having a detection area aspect ratio of 2:3, the focal distance f=32.4 mm, making the sensor bulky. In order to reduce the size of the sensor, each detector receives maximum detection from only one lens, as illustrated in FIG. 4.

Figure 4:
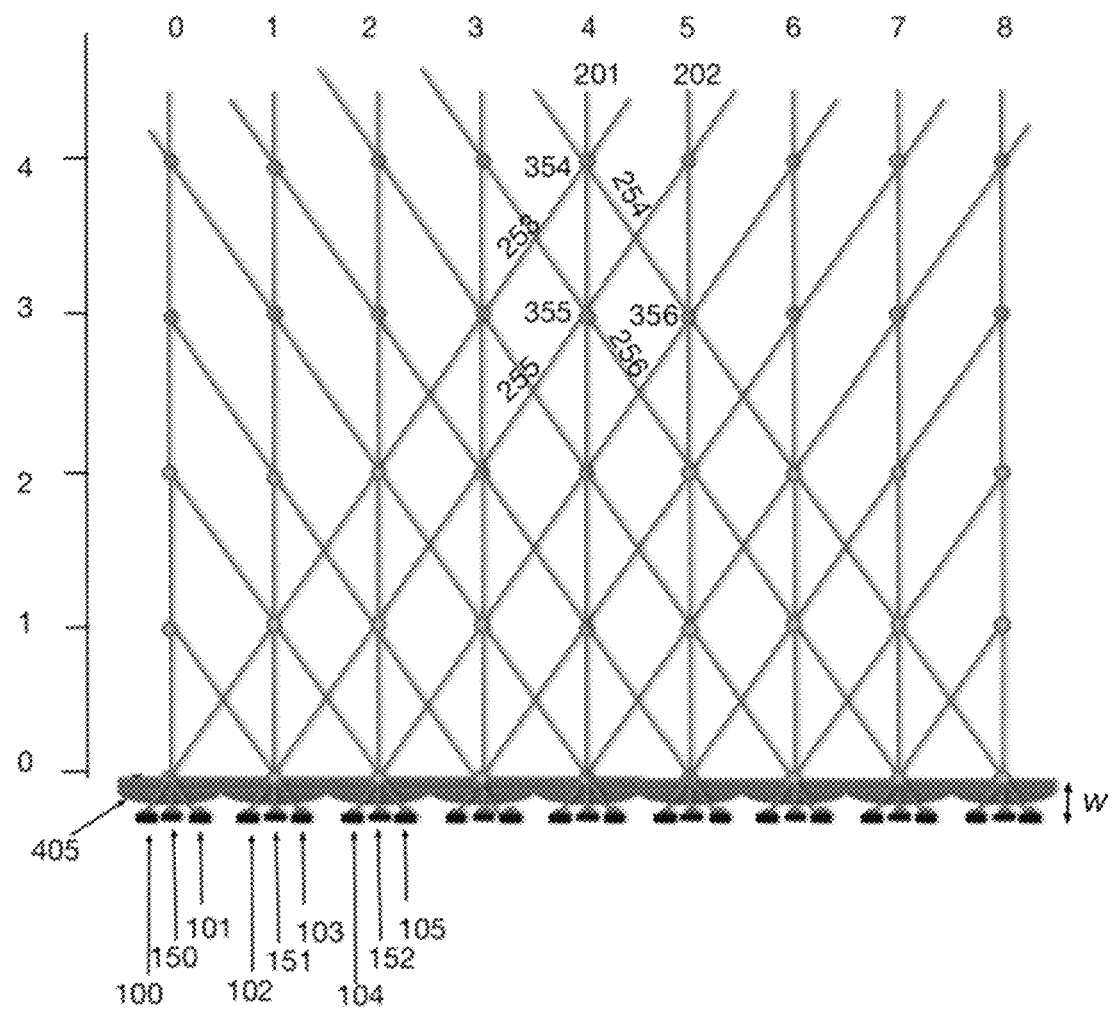
FIGS. 4 and 5 are illustrations of alternative configurations of emitters and detectors in a proximity sensor, in accordance with embodiments of the present invention.
Figure 5:
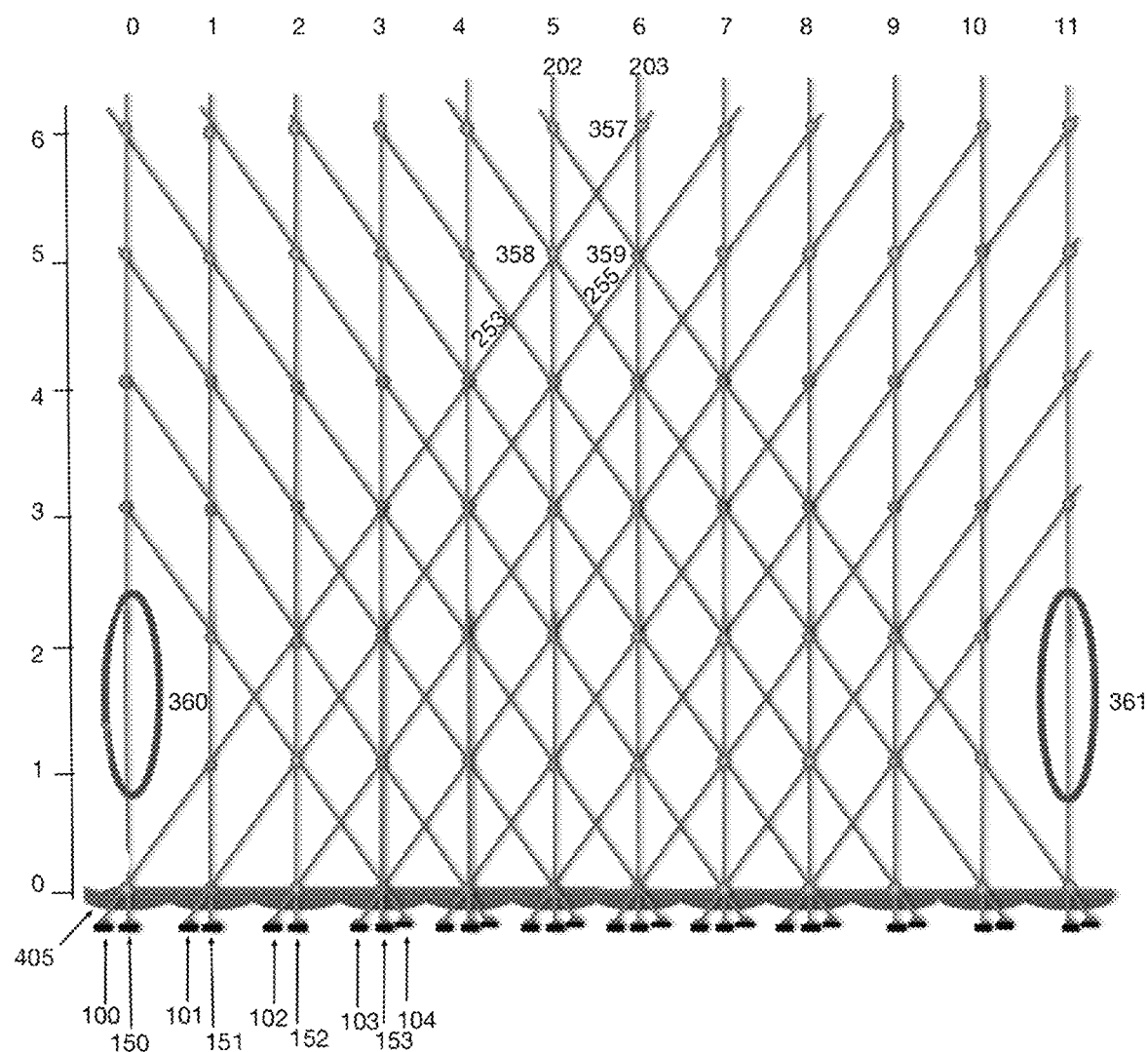

Reference is made to FIGS. 4 and 5, which are illustrations of alternative configurations of emitters and detectors in a proximity sensor, in accordance with embodiments of the present invention. FIG. 4 shows a gesture sensor in which the pitch between emitters is 21.6 mm, and having a detection area aspect ratio of 2:3, but each detector receives maximum detection from only one lens. This enables a slimmer sensor width than that of the sensor in FIG. 3, as may be seen by comparing focal distance f in FIG. 3 to focal distance w in FIG. 4. Certain elements in FIG. 4 are numbered. They are emitters 150-152, detectors 100-105, emitter light beams 201 and 202, corridors of maximum detection 253-256, hotspots 354-356, and array of lenses 405. FIG. 4 shows four rows of hotspots 1-4 in the detection plane outside the sensor, and an additional row of hotspots (row 0) adjacent to lenses 405.

The gesture sensors in FIGS. 3 and 4 have a 4×9 grid of hotspots in the sensor detection area. A processor 300 (shown in FIG. 1) controls activation of emitter-detector pairs and has a limited number of I/O ports for connecting to the emitters and detectors. The gesture sensor configuration shown in FIG. 4 has nearly twice as many detectors as that shown in FIG. 3. Thus, whereas the sensor of FIG. 3 has 20 components—9 emitters and 11 detectors, the sensor of FIG. 4 has 27 components—9 emitters and 18 detectors. Alternative arrangements of emitters and detectors provide different hotspot distributions across the sensor detection area while using similar numbers of i/o ports on the processor. One such arrangement is shown in FIG. 5.

Figure 7:
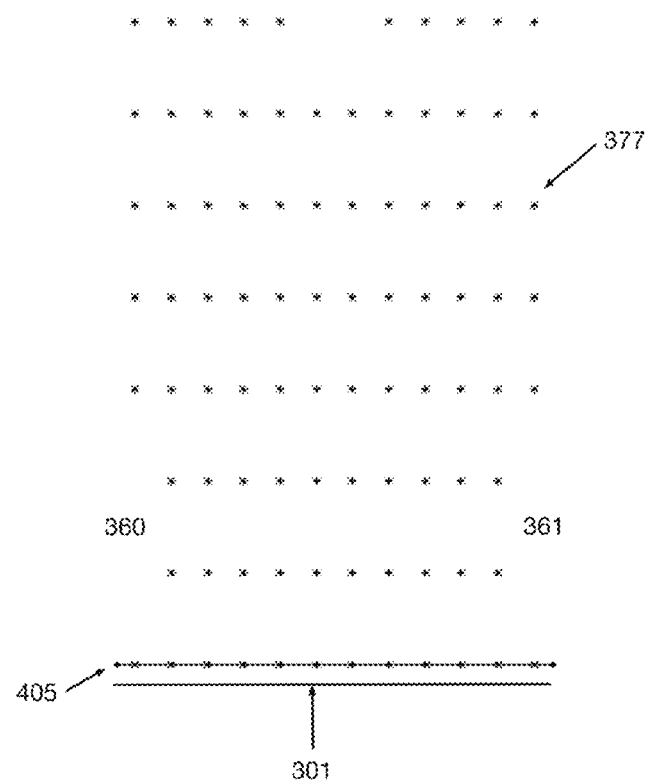
FIG. 7 is an illustration of a distribution of hotspots generated by the proximity sensor of FIG. 6, in accordance with an embodiment of the present invention.
Figure 11:
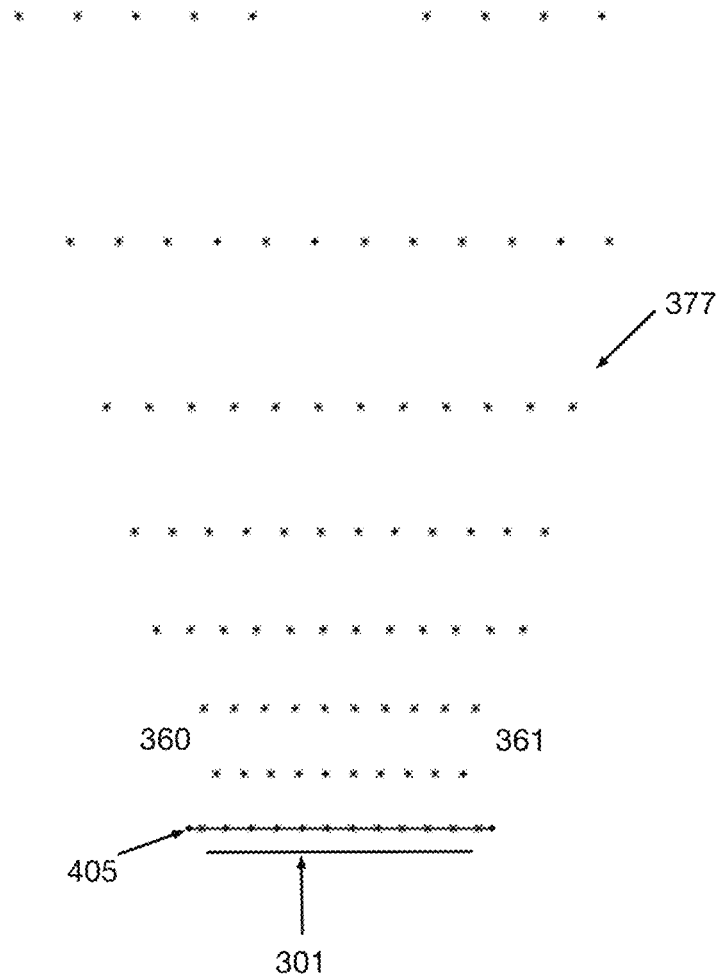
FIG. 11 is an illustration of a distribution of hotspots generated by the proximity sensor of FIG. 10, in accordance with an embodiment of the present invention.

FIG. 5 shows an arrangement of 30 components—12 emitters and 18 detectors, that provides a 6×12 grid of 68 hotspots, and an additional row of hotspots (row 0) adjacent to lenses 405. The arrangement in FIG. 5 couples one detector with each of the lenses near the ends of the sensor, and couples two detectors with each of the lenses in the middle of the sensor, resulting in an absence of hotspots in regions 360 and 361 at the outer edges of hotspot rows 1 and 2. Regions 360 and 361 lacking hotspots are also indicated in FIGS. 7 and 11. Certain additional elements in FIG. 5 are numbered. They are emitters 150-153, detectors 100-104, emitter light beams 202 and 203, corridors of maximum detection 253 and 255, hotspots 357-359, and, array of lenses 405.

One difference between gesture detection and touchscreen touch detection is that touchscreens require precision when correlating a detected location with a corresponding screen location, whereas gestures, and especially in-air gestures, do not need to map hotspots to specific locations; rather, gesture detection requires that the relationship between hotspots within the detection plane is maintained. This feature of gesture sensors relaxes many of the tolerance requirements for touchscreen sensors, as discussed below.

Figure 6:
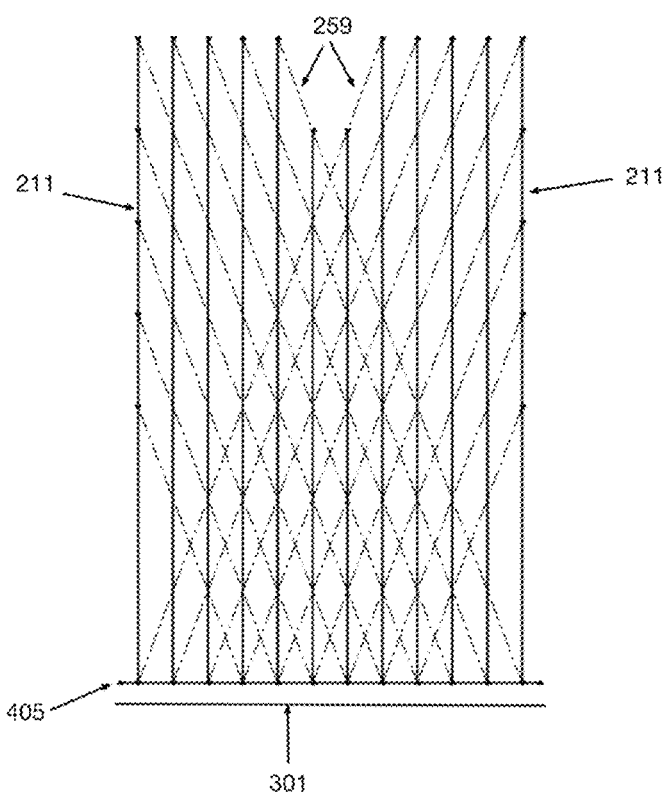
FIG. 6 is an illustration of emitter light beams and corridors of maximum light detection for a proximity sensor in which the emitter and detector components are aligned with their respective lenses, in accordance with an embodiment of the present invention.
Figure 8:
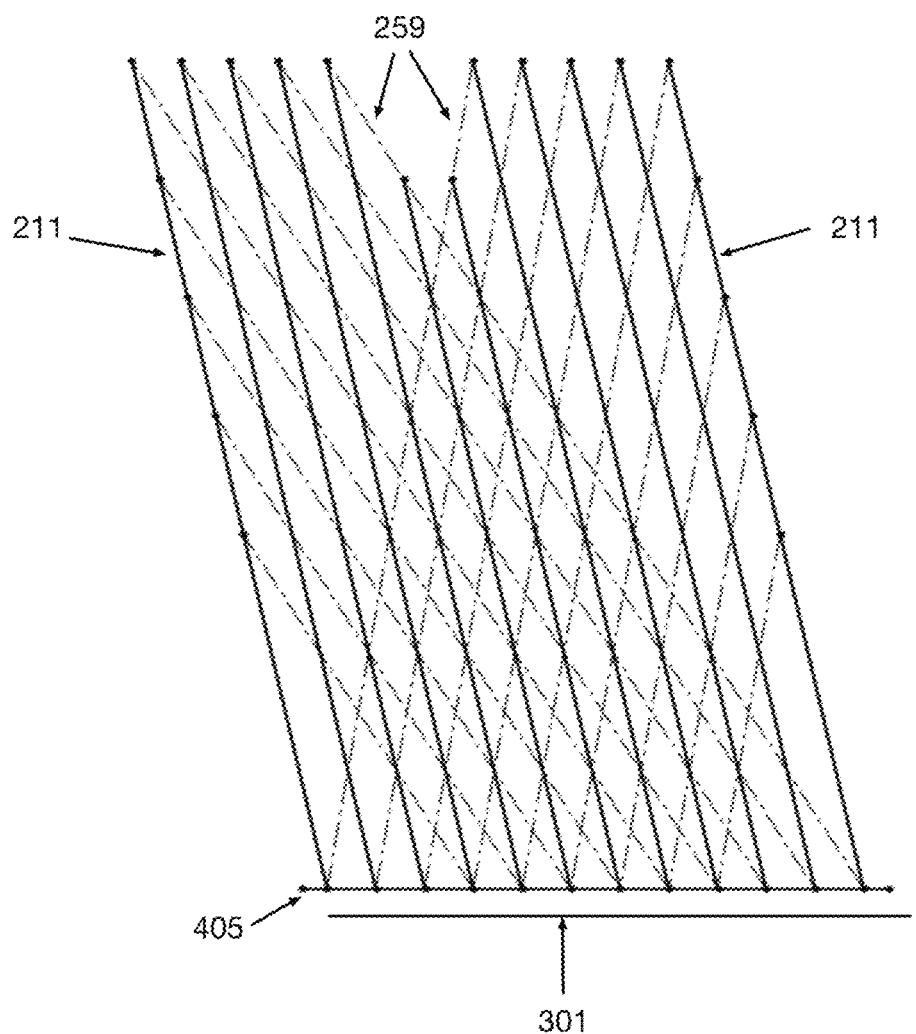
FIG. 8 is an illustration of emitter light beams and corridors of maximum light detection for a proximity sensor in which there is an offset in the alignment between the emitter and detector components and their respective lenses, in accordance with an embodiment of the present invention.
Figure 9:
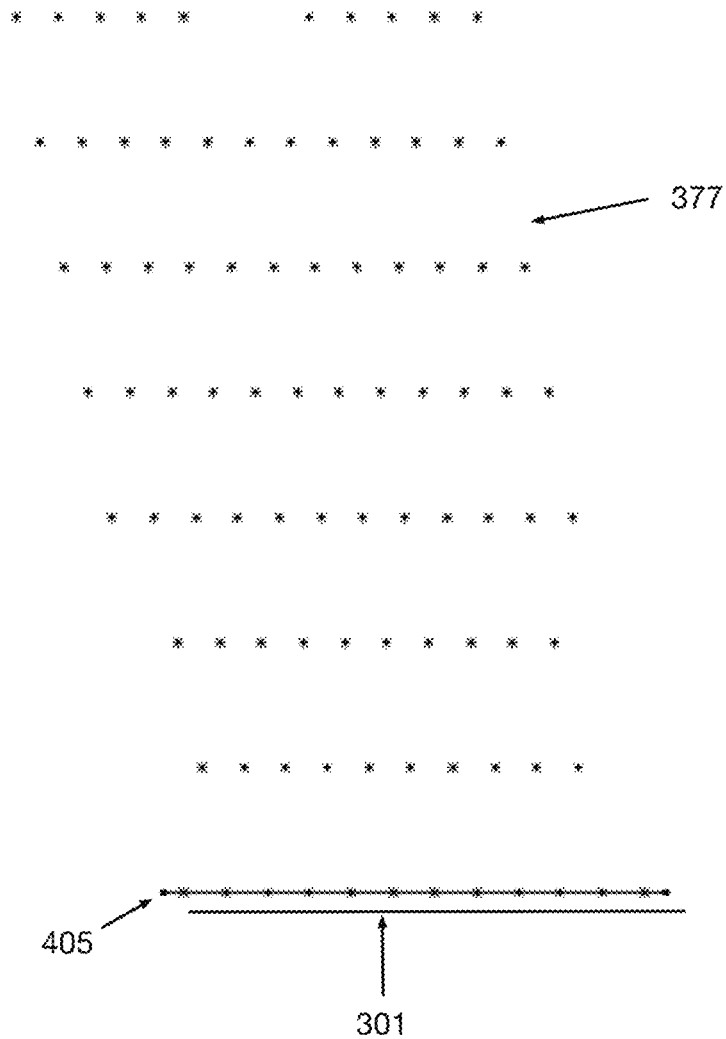
FIG. 9 is an illustration of a distribution of hotspots generated by the proximity sensor of FIG. 8, in accordance with an embodiment of the present invention.
Figure 10:
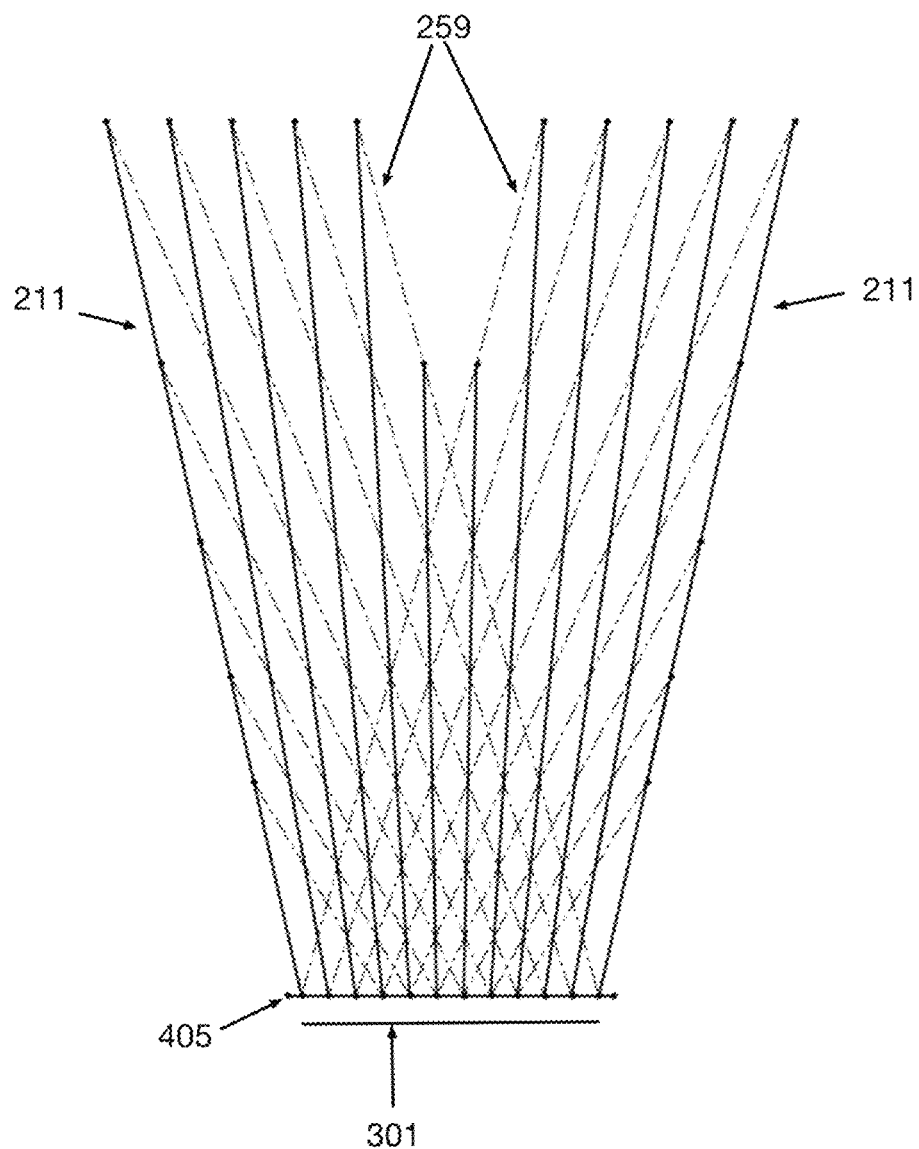
FIG. 10 is a simplified illustration of a proximity sensor, in accordance with an embodiment of the present invention.

Reference is made to FIG. 6, which is an illustration of emitter light beams and corridors of maximum light detection for a proximity sensor in which the emitter and detector components are aligned with their respective lenses, in accordance with an embodiment of the present invention. Reference is also made to FIG. 7, illustrating a distribution of hotspots generated by the proximity sensor of FIG. 6, in accordance with an embodiment of the present invention. In the sensor shown in FIG. 6, lenses 405 are aligned with their respective emitter and detector components on PCB 301. In FIGS. 6, 8 and 10, emitter beams 211 are represented by solid lines, and corridors of maximum detection 259 are represented by dashed-dotted lines. In FIGS. 7, 9 and 11, hotspots are represented by asterisks. FIG. 7 shows rectangular array of hotspots 377 generated by the proximity sensor of FIG. 6. Array 377 includes seven rows of hotspots, each row being a different distance from the proximity sensor, and an additional row of hotspots adjacent to lenses 405. As discussed hereinabove with reference to FIG. 5, this proximity sensor was configured such that zones 360 and 361 lack hotspots, in order to maximize the total number of hotspots generated by the sensor.

Reference is made to FIG. 8, which is an illustration of emitter light beams and corridors of maximum light detection for a proximity sensor in which there is an offset in the alignment between the emitter and detector components and their respective lenses, in accordance with an embodiment of the present invention. In the sensor shown in FIG. 8 there is a misalignment between lenses 405 and their respective emitter and detector components on PCB 301; namely, lenses 405 are shifted to the left of their respective components on PCB 301. This misalignment results in emitter beams 211 being directed at an angle, and corridors of maximum detection 259 being skewed to the left.

Reference is made to FIG. 9, which is an illustration of a distribution of hotspots generated by the proximity sensor of FIG. 8, in accordance with an embodiment of the present invention. Specifically, array of hotspots 377 is skewed as a non-rectangular parallelogram. This error is significant for touchscreens where the underlying screen is rectangular, but not for gesture sensors, as long as the ordinal arrangement of hotspots is unchanged, since an object's movement within the detection area is still accurately described by the series of hotspots at which the object is detected while performing the gesture. The key feature is that the relationship between hotspots is maintained even though they are skewed.

Other offsets between components and lenses in proximity sensors in accordance with an embodiment of the present invention may occur, inter alia lens shrinkage and PCB shrinkage, resulting in hotspot layouts that are trapezoidal. This would be a significant problem for touchscreen sensors as it causes a mismatch between hotspots and screen locations. But this issue is less of a problem for gesture sensors-provided that the ordinal relationship between neighboring hotspots is maintained. For example, lens shrinkage results in hotspots moving closer to their neighbors the further they are located from the sensor, but a series of detections over time still indicates the direction of the object's movement. And if the PCB shrinks in relation to the lenses, the distance between neighboring hotspots will increase as the hotspots are located further from the sensor, and the hotspot arrangement expands in a fan shape as it moves away from the sensor. But in this case too, a series of object detections over time indicates the object's movement. Thus, gesture sensors are extremely tolerant of systematic errors.

Reference is made to FIG. 10, which is a simplified illustration of a proximity sensor, in accordance with an embodiment of the present invention. FIG. 10 shows lenses designed to provide a fan-shaped distribution of hotspots in the detection plane, e.g., each emitter beam is directed by lenses 405 such that the plurality of beams 211 radiate to resemble the supporting sticks of a fan, and the corridors of maximum detection 259 are configured by lenses 405 to intersect the emitter beams. Thus, lenses 405 fan out light beams 211 from the plurality of light emitters in non-parallel, non-intersecting directions along the projection plane.

Reference is made to FIG. 11, which is an illustration of a distribution of hotspots generated by the proximity sensor of FIG. 10, in accordance with an embodiment of the present invention. FIG. 11 shows hotspot array 377 wherein the rows of hotspots get progressively wider the further they are from PCB 301. In some embodiments of the invention, the length of the row of hotspots furthest from the sensor is three-times the length of the sensor.

From a comparison between the proximity sensor of FIGS. 6 and 7 and the proximity sensor of FIGS. 10 and 11 it is evident that, if the same number of emitters and detectors are used in both sensors, the sensor of FIGS. 10 and 11 monitors a larger area than the sensor of FIGS. 6 and 7. Specifically, the outer rows of hotspots in FIG. 11 are wider than the rows in FIG. 7; and the outer rows of hotspots in FIG. 11 are also further from the sensor than the rows in FIG. 7. Conversely, in FIG. 11, the distance between rows of hotspots increases the further the row is from the sensor. Thus, the sensor in FIGS. 10 and 11 is well suited for applications that require greater detection resolution as an object gets nearer to the sensor. An example of such an application is a collision avoidance system for an automatic door opener.

In certain embodiments of the invention reflections made by an object near the sensor are detected with stray reflections that make these detections unreliable. Thus, the nearest rows of hotspots shown in FIGS. 7 and 11 are not used, and the remaining-active-rows of hotspots in FIG. 11 are wider than their corresponding rows in FIG. 7, making the active detection area in FIG. 11 wider than that of FIG. 7.

Detection signals according to the present invention are mapped as an image, whereby the detected reflection value for each emitter-detector pair is mapped to the corresponding hotspot location in the sensor 2D detection plane. Thus, the sensors depicted in FIGS. 3 and 4 are configured for 9×5 grids of hotspots; accordingly, outputs from these sensors are mapped as 9×5 images. Similarly, the sensor depicted in FIG. 5 is configured for a 13×7 grid of hotspots, and the sensor depicted in FIG. 10 is configured for a fan-shaped arrangement of hotspots. Outputs from these sensors are thus mapped as a 13×7 image, and as a fan-shaped pixel arrangement, respectively.

Software for gesture detection takes a different approach than touch detection, in accordance with embodiments of the present invention. Specifically, a sensor used for touch detection must identify the exact location within the detection area at which the object is located, whereas the object's exact location is not needed in order to identify a gesture. In practice, touch detection algorithms require much noise filtering, which is both costly and discards much sensor data, whereas matrix-based algorithms are less costly and retain more of the original data. Matrix-based algorithms are more useful for object recognition and movement detection than for calculating the exact location of an object. Correlation with defined shapes is used to identify the type or characteristics of the object performing the gesture, for example, to confirm that a hand is performing the gesture, and correlation with time shift identifies movement.

Figure 12:
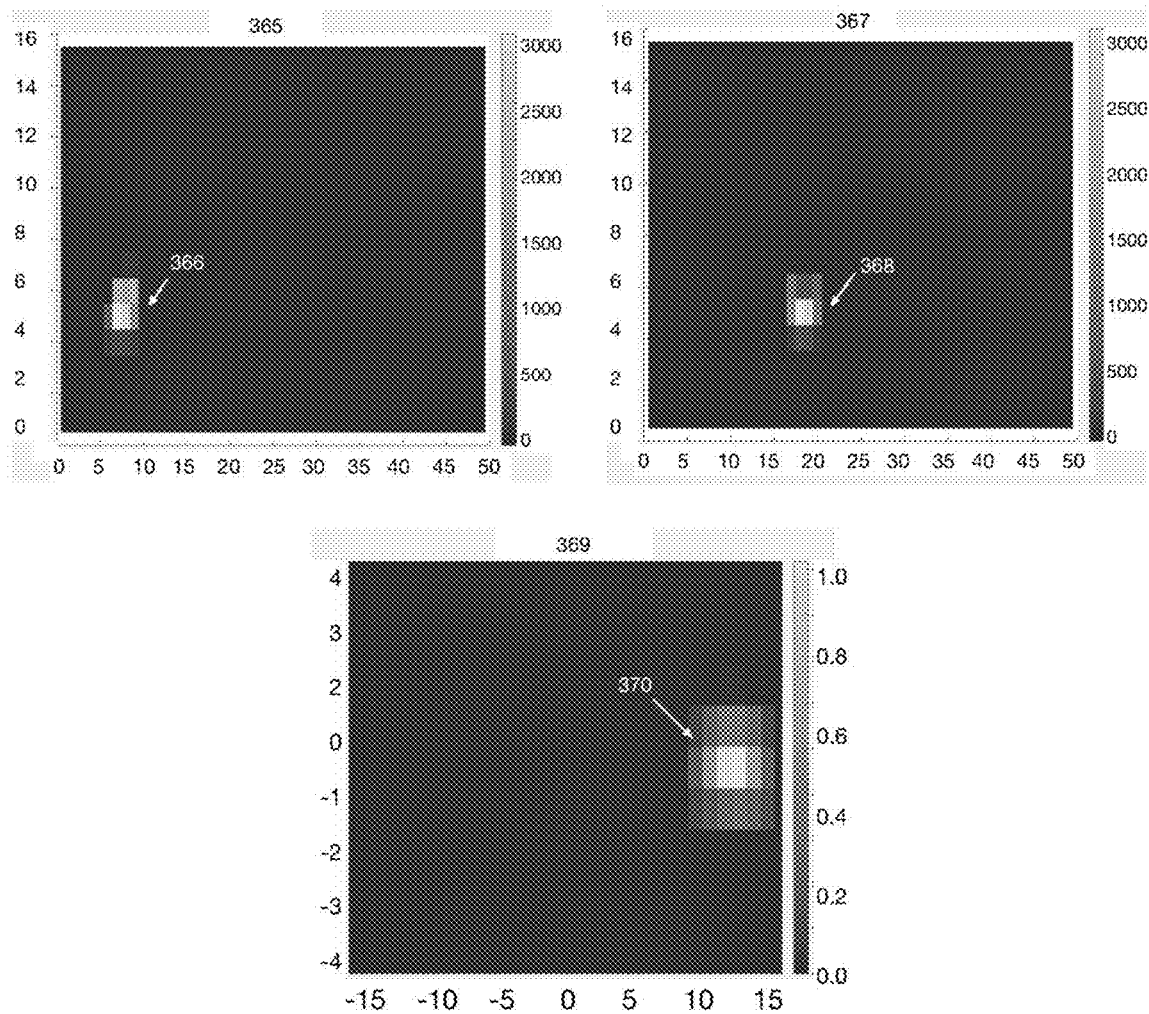
FIG. 12 is a simplified illustration of image correlation performed using outputs of a proximity sensor, in accordance with an embodiment of the present invention.

Reference is made to FIG. 12, which is a simplified illustration of image correlation performed using outputs of a proximity sensor, in accordance with an embodiment of the present invention. FIG. 12 shows two images 365 and 367 of detection signals from a gesture sensor at different times while a hand is moving in the sensor's detection area. Detected reflections 366 and 368 of the hand are shown. Image 369 is the output of a correlation performed using MATLAB software on the images 365 and 367. MATLAB is a trademark of The Mathworks Inc. Corporation. Correlation 369 shows that the object is moving to the right. In some embodiments of the invention, the images are masked so that the correlation processes only the locations of significant reflections, e.g., the Landy-Szalay estimator allows treatment of masked-out areas and boundaries.

For slow-moving objects it may be difficult to ascertain whether a gesture is being performed based on image correlation using only pairs of successive images. In some embodiments of the invention, multiple images are stored and a current image is correlated with older images to identify movement gestures. In some embodiments, in order to optimize the memory requirements for storing multiple images, one image is stored and used for image correlation with a series of newer images. For example, for an image n, images n-1, n-2, n-4, n-8 are stored and used for image correlation. At each new frame, the image stored as image n-1 is updated; at every second frame, the image stored as image n-2 is updated with what was previously stored as image n-1; at every fourth frame, the image stored as image n-4 is updated with what was previously stored as image n-2; and at every eighth frame, the image stored as image n-8 is updated with what was previously stored as image n-4. The system stores a timestamp for each image to be used when correlating an older image with a new current image so that the movement indicated by the image correlation is normalized by the time interval between the current image and the older image.

In some embodiments of the invention the 2D array of detection signals is transformed into 1D arrays, namely, a horizontal profile and a vertical profile, to simplify processing. For example, the detection signals for all hotspots along each emitter beam are summed to provide a single value for each emitter beam. I.e., for the sensors in FIGS. 3 and 4, this process creates a horizontal profile of 9 values, and for the sensor in FIG. 5, this process creates a horizontal profile of 12 values. In addition, the detection signals for all hotspots in each row of hotspots are summed to provide a single value for each hotspot row. I.e., for the sensors in FIGS. 3 and 4, this process creates a vertical profile of 5 values, and for the sensor in FIG. 5, this process creates a vertical profile of 7 values. Each profile is processed independently. TABLE IV below summarizes the processes for each profile vector.

TABLE IV

Profile Processing

| Operation | Example Method |
|---|---|
| Remove noise and extraneous reflections from the profile | Run an infinite impulse response (IIR) filter on a series of prior profile vectors to create a vector of baseline values representing expected values when no object is detected. Subtract the baseline vector from the profile signals vector. |
| Normalize the profile signals | Divide the profile vector by the vector's standard deviation. |
| Calculate object movement and velocity | Perform autocorrelation between profile vectors generated at different times. The Pearson correlation coefficient is used to measure the strength or weakness of the autocorrelation result. |
| Calculate object size and center of gravity | The mean of the profile vector corresponds to the object's center of gravity, and the standard deviation of the profile vector corresponds to the object's size. |

Figure 13:
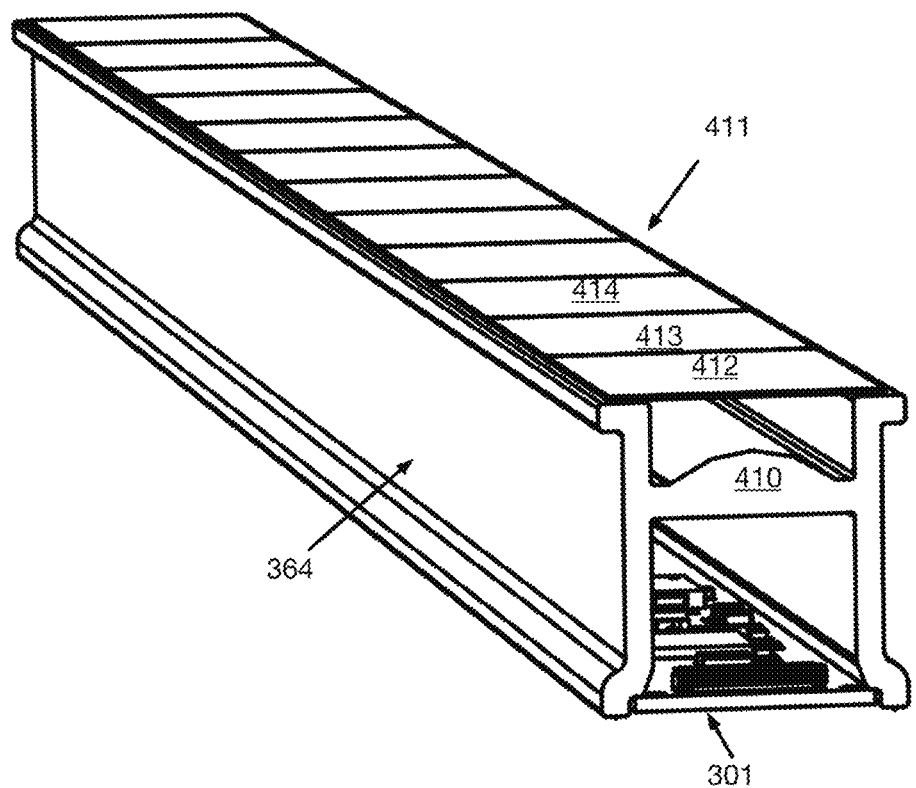
FIG. 13 is a simplified illustration of a proximity sensor optimized for gesture detection, in accordance with an embodiment of the present invention.

Reference is made to FIG. 13, which is a simplified illustration of a proximity sensor optimized for gesture detection, in accordance with embodiments of the present invention. The outer housing of the proximity sensor in FIG. 13 has been removed, exposing the sensor's internal components. This proximity sensor features support structure 364, above PCB 301 on which emitters and detectors are arranged as discussed hereinbelow with reference to FIG. 14, and two layers of lenses 410 and 411. As discussed above in regard to FIG. 1, the lenses collimate light from each emitter and direct maximum light onto the detectors when the light enters the lenses at particular angles. In the proximity sensor shown in FIG. 13, lens 410 is formed as an extruded cylindrical lens that collimates light along the width of the sensor. Lens array 411 collimates light along the length of the sensor. Extruded lens 410 is formed as part of support structure 364. Lens array 411 features Fresnel lens units 412-414 that collimate light along the length of the sensor. Each Fresnel lens unit directs incoming light onto one or two detectors, and collimates outgoing light from a neighboring emitter.

As discussed hereinabove with respect to FIGS. 4 and 5, the height of the sensor may be reduced if each detector receives maximum light intensity from only one lens, not two, and the emitters and detectors are placed near their respective lenses.

Lenses 410 and 411 are easy to mass produce, making proximity sensors according to the present invention cheaper to produce than sensor 351 of FIG. 1, both in terms of assembly costs and bill of materials. Lenses 410 and 411 are also available as off-the-shelf optical components, reducing cost, manufacturing and overhead for the sensor manufacturer. For example, Fresnel lenses are available as a film for mounting on a clear plastic substrate.

Referring still to FIG. 13, lens array 411 is supported by a ledge along the perimeter of an opening at the top of the sensor, and support structure 364 has an H-shaped cross-section with lens 410 formed as part of this support. The side walls of support structure 364 need not be parallel. The sensor housing (not shown) may be manufactured in several ways, inter alia, as a sheet metal casing.

Figure 14:
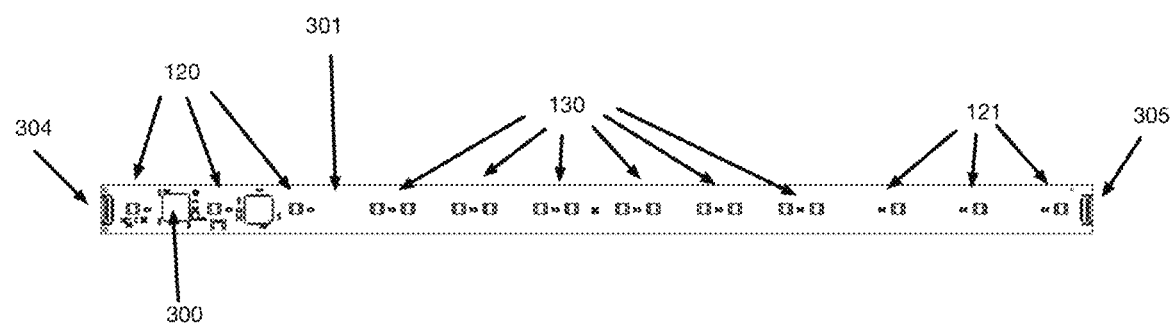
FIG. 14 is a simplified illustration of a PCB for the proximity sensor of FIG. 13, in accordance with an embodiment of the present invention.

Reference is made to FIG. 14, which is a simplified illustration of a PCB for the proximity sensor of FIG. 13, in accordance with an embodiment of the present invention. FIG. 14 shows PCB 301 on which emitters and detectors are mounted. The emitters and detectors in FIG. 14 are shown as square, with the detectors being larger than the emitters. As discussed hereinabove with respect to FIG. 5, a non-uniform distribution of emitters and detectors often provides a larger number of hotspots in the detection plane than a uniform distribution. Thus, each of the three emitters at the outer edges of PCB 301 has a single neighboring detector, whereas each of the six emitters in the middle portion of PCB 301 is sandwiched between two detectors (elements 130). FIG. 14 shows three pairs 120 of an emitter and a left-neighbor detector at the left end of PCB 301, and three pairs 121 of an emitter and a right-neighbor detector at the right end of PCB 301. PCB 301 features a processor 300 that controls synchronous co-activation of emitter-detector pairs and communicates with a host system. FIG. 14 also shows communication ports 304 and 305 at the two ends of PCB 301.

Figure 15:
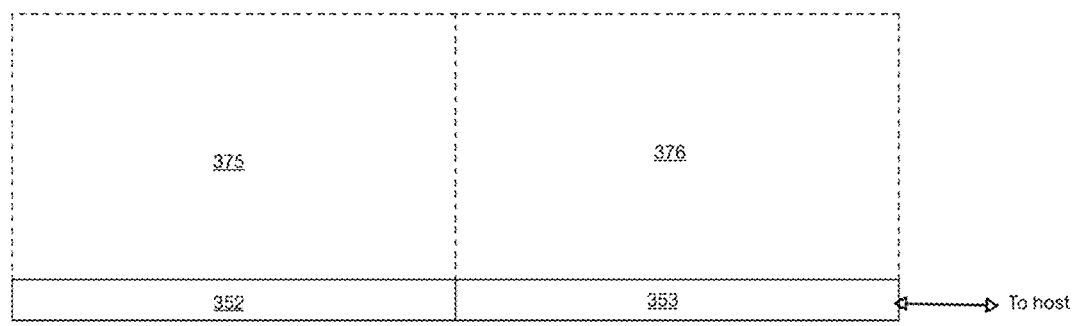
FIG. 15 is a simplified illustration of two proximity sensors connected to form an extended sensor, in accordance with an embodiment of the present invention.

Sensors according to the present invention are modular. Reference is made to FIG. 15, which is a simplified illustration of two proximity sensors connected to form an extended sensor, in accordance with an embodiment of the present invention. FIG. 15 shows gesture detector modules 352 and 353 connected to form a long sensor. Each sensor module detects objects in its respective detection zone 375, 376, whereby these neighboring detection zones form a long detection area. Sensor module 353 is designated the master, and sensor module 352 is configured as a slave. The master module receives outputs from the slave and interfaces with the host system. Each sensor module includes an I2C interface at both ends of the sensor, e.g., communication ports 304 and 305 in FIG. 14, to enable communication between modules and between the master module and the host system.

Figure 16:
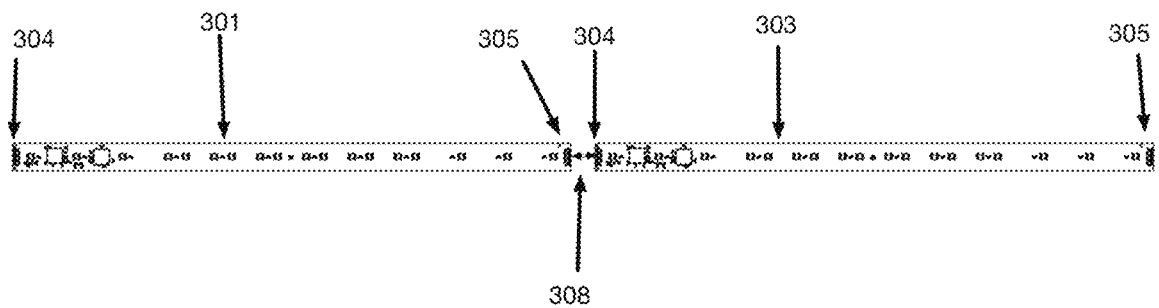
FIG. 16 is a simplified illustration of a communication bus connection between proximity sensors, in accordance with an embodiment of the present invention.

Reference is made to FIG. 16, which is a simplified illustration of a communication bus connection between proximity sensors, in accordance with an embodiment of the present invention. FIG. 16 shows element 305 on PCB 301 of a first sensor module connected to element 304 on PCB 303 of a second sensor module, to create an I2C communication bus 308 that enables processors 300 on the two modules to communicate and coordinate each module's activation of its emitters and detectors, and to output the results from the slave sensor module to the master sensor module. Although FIGS. 15 and 16 show only two connected modules, additional modules may be connected to form an extended series of sensor modules, and a corresponding extended detection zone. One of the sensor modules is designated as the master and all others are slaves.

Figure 17:
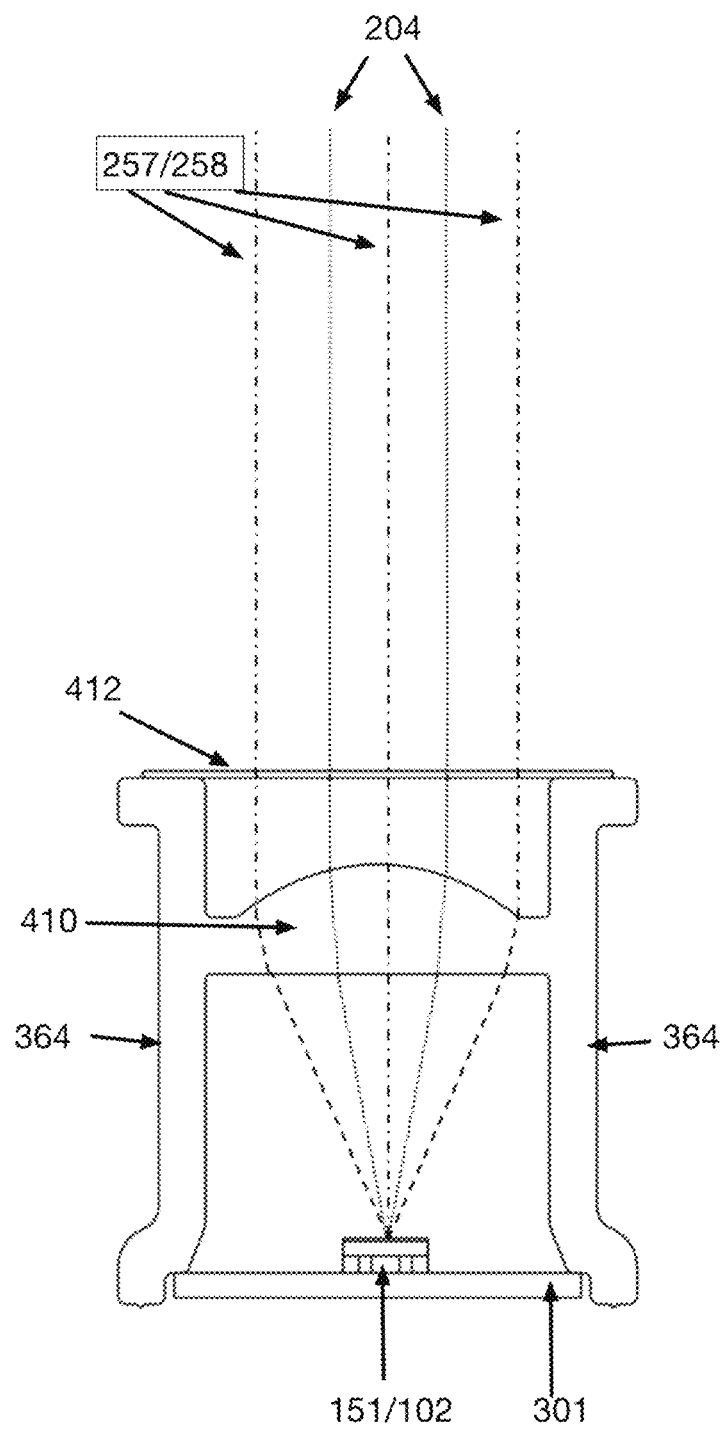
FIGS. 17 and 18 are simplified illustrations showing how the lenses are configured in relation to the light emitters and light detectors, in the proximity sensor of FIG. 13, in accordance with an embodiment of the present invention.
Figure 18:
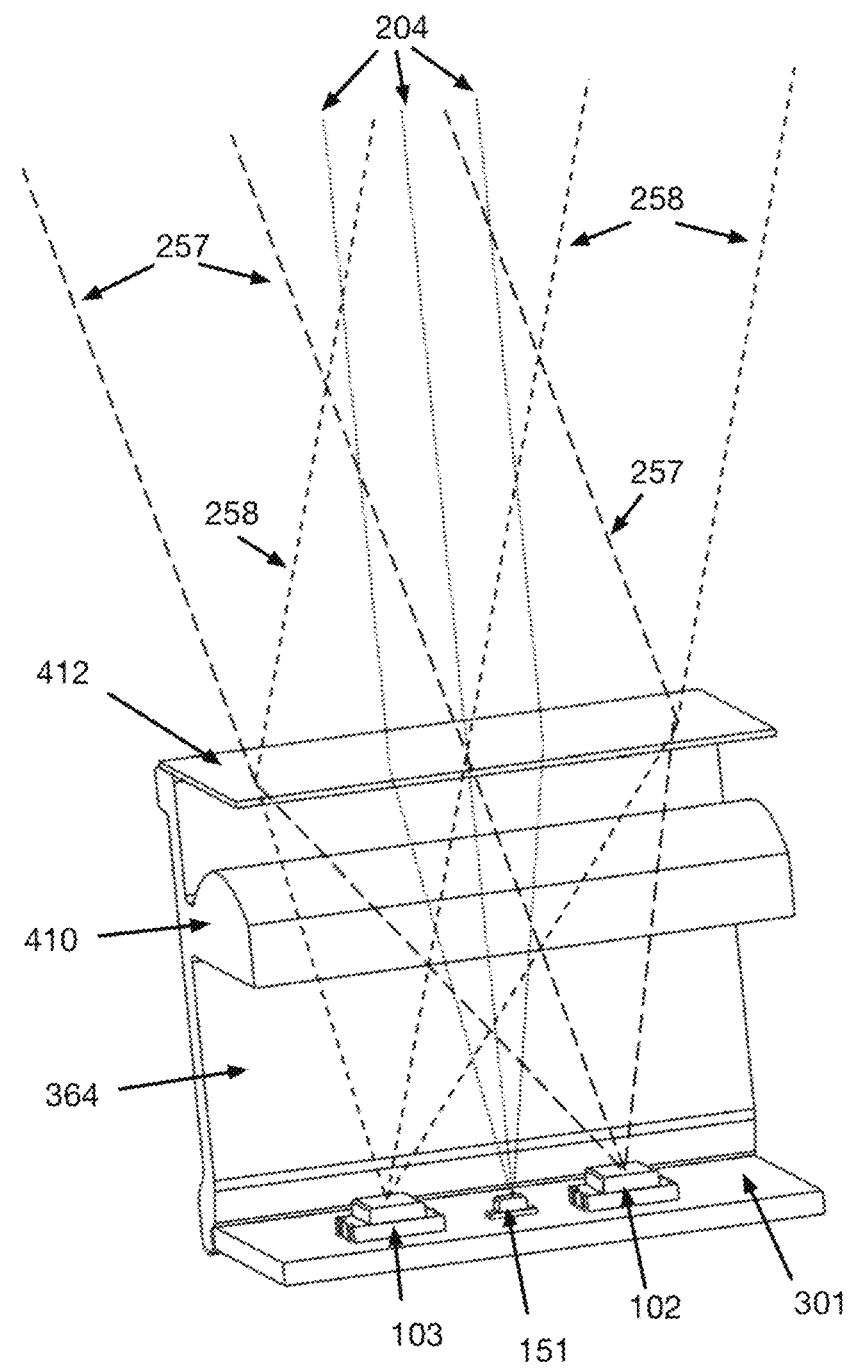

Reference is made to FIGS. 17 and 18, which are simplified illustrations showing how the lenses are configured in relation to the light emitters and light detectors in the proximity sensor of FIG. 13, in accordance with an embodiment of the present invention. In FIGS. 17 and 18, emitter beams 204 are represented by dotted lines. In FIG. 17, paths of maximum detection for the detectors are represented by dashed-dotted lines. FIG. 18 shows paths of maximum detection 257 and 258, represented by dashed lines, with the dashes in paths 257 being larger than the dashes in paths 258. FIG. 17 shows a cross-sectional view of the proximity sensor of FIG. 13. In this view, cylindrical lens 410 collimates emitter beams 204 and directs incoming beams arriving along the paths of maximum detection 257 and 258 onto the detectors, such as detector 102. Fresnel lens 412 does not collimate light in this direction.

FIG. 18 shows a segment of a larger sensor. In FIG. 18, one of two support walls 364 in FIG. 17 has been removed so that the light beam paths may be seen. FIG. 18 shows how Fresnel lens 412 directs incoming light along two corridors of maximum detection 257 and 258 onto detectors 102 and 103, respectively, and also collimates emitter light beams 204.

In some embodiments of the invention, the proximity sensor housing is further encased in hermetically sealed plastic transparent to infrared light to protect the sensor from the environment, particularly when the sensor is mounted on an exposed surface such as an exterior panel of a car door or liftgate. One example of plastic sealing is heat-shrink tubing ordinarily made of polyolefin, which shrinks radially (but not longitudinally) when heated, to between one-half and one-sixth of its diameter.

Figure 19:
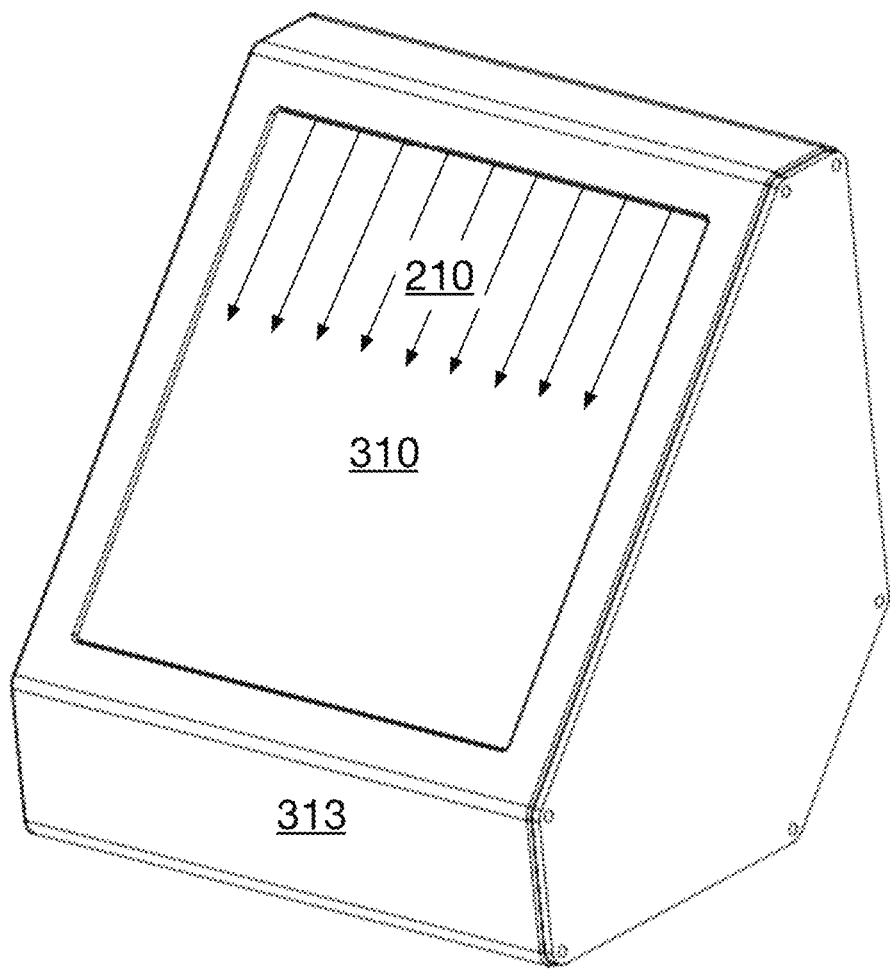
FIG. 19 is a simplified illustration of a wireless trackpad, in accordance with an embodiment of the present invention.

Reference is made to FIG. 19, which is a simplified illustration of a wireless trackpad, in accordance with an embodiment of the present invention. FIG. 19 shows a wireless trackpad that includes a power source, such as a battery, and a wireless communication module, such as Bluetooth, all encased in a ruggedized housing 313. A proximity sensor according to the present invention is mounted in the ruggedized housing along the top edge of the touch surface, and the light emitting and receiving edge of the sensor is positioned as a raised edge along the top of touch surface 310. Emitter light beams 210 from the proximity sensor are shown traveling along touch surface 310. The housing, the touch surface and the exposed edge of the sensor are encased in plastic transparent to infrared light so that the sensor light beams may travel above and across touch surface 310 and detect touch gestures thereon. This hermetically sealed system is useful for rugged environments as well as sanitary environments such as hospitals and operating theaters. For example, in robot-assisted surgeries, the robot may be controlled by a technician in the operating room using this sterile trackpad. In addition, doctors and nurses wearing gloves may interact with computers and computer monitors in an operating room using this sterile trackpad. The exterior of the housing may be safely washed or wiped down with disinfectant. Some encased trackpads according to the present invention feature wireless charging for the battery, and in other embodiments the encased trackpad is intended for one-time use, i.e., until the battery charge has been depleted.

Figure 20B:
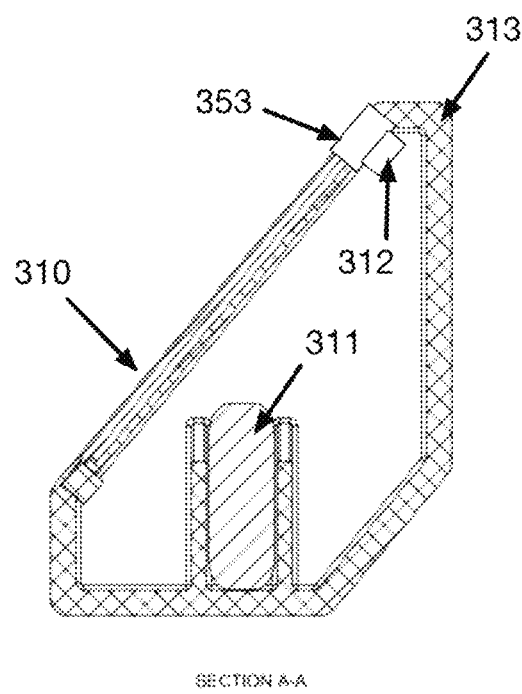
FIGS. 20A and 20B are illustrations of a cross section of the wireless trackpad of FIG. 19, in accordance with an embodiment of the present invention.
Figure 20A:
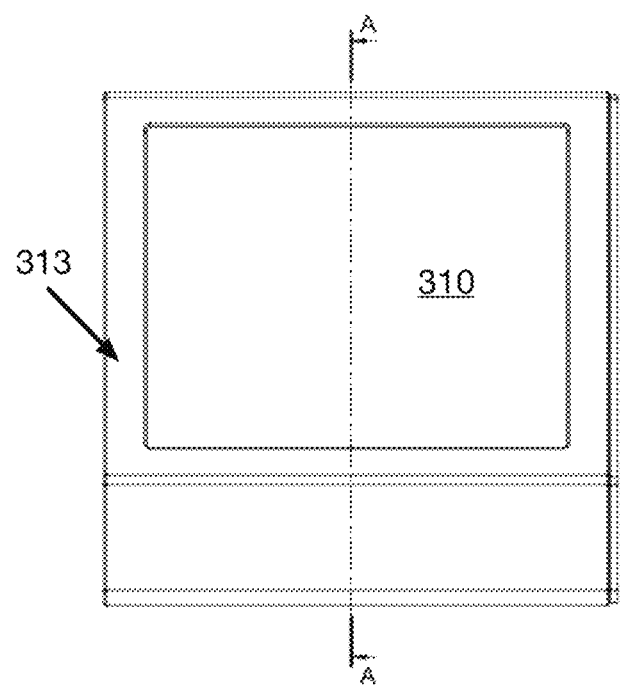

Reference is made to FIGS. 20A and 20B, which are illustrations of a cross section of the wireless trackpad of FIG. 19, in accordance with an embodiment of the present invention. FIG. 20A shows a cross section along the line A-A of the wireless trackpad of FIG. 19. FIG. 20B shows proximity sensor 353 along the top edge of touch surface 310 and wireless communication chip 312, as well as battery 311 for powering both the sensor and the wireless communication.

Applications for a gesture sensor as described hereinabove include automatic car doors and liftgates. In automatic car doors and liftgates, a sensor according to the present invention, mounted in the moving door or liftgate panel, detects objects that the door or liftgate is approaching, such as a curb, tree or neighboring parked car. The distance between the object and the door or liftgate panel is reported to the door or liftgate control system. Correlation with defined shapes is used to identify the type or characteristics of the approaching object, e.g., whether that object is a curb, a shrub, or a person. The door or liftgate control system halts movement of the door or liftgate panel before it collides with the object.

Applications for a gesture sensor as described hereinabove include mobile phones, tablet computers, connected-home products and vehicle cabins. Certain embodiments of these products include a radar sensor and an optical proximity sensor in accordance with embodiments of the invention. The radar and optical sensors complement each other by providing redundant detection of gestures. For certain gestures, the optical sensor provides faster and more accurate detection than the radar sensor. For example, the optical gesture sensor detects the location of the object with greater precision than the radar sensor. The optical and radar sensors are not capable of capturing personal features in an image such as, for example, time-of-flight cameras. Thus, privacy concerns are alleviated. In certain applications, before a user is detected approaching the device, one of the sensors is activated in standby mode to detect the approaching user and the other sensor is in sleep mode. The sensor in sleep mode is woken up when the sensor in standby mode detects an approaching user.

In certain embodiments of the invention, the emitters and detectors in a gesture sensor with cylindrical and Fresnel lenses are arranged along a planar curve, thereby providing detection of objects passing through a volume, rather than a two-dimensional plane, above the sensor. This sensor is included in mobile phones, tablet computers, connected-home devices and vehicle cabins to detect in-air gestures. For example, the sensor is mounted behind the display cover glass in a mobile phone, tablet computer, connected-home device or vehicle infotainment system, and projects light beams through the cover glass to detect in-air gestures performed opposite the cover glass.

Figure 21:
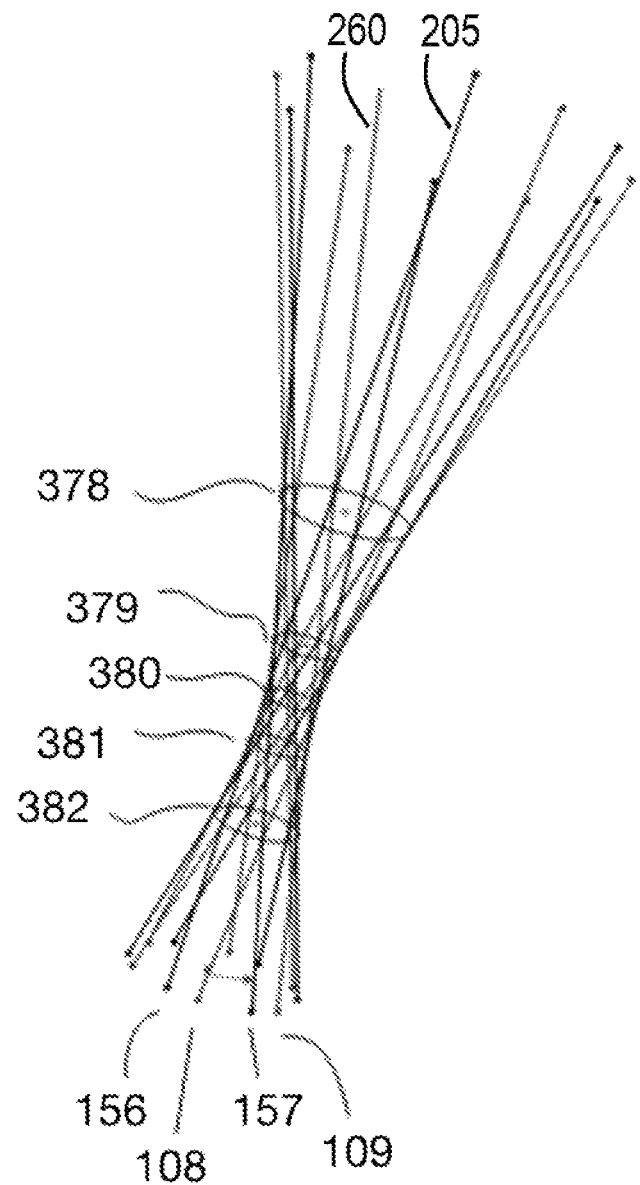
FIGS. 21 and 22 are simplified illustrations of emitter beams and corridors of maximum detection for proximity sensors configured to detect presence of an object in 3D space, in accordance with embodiments of the present invention.
Figure 22:
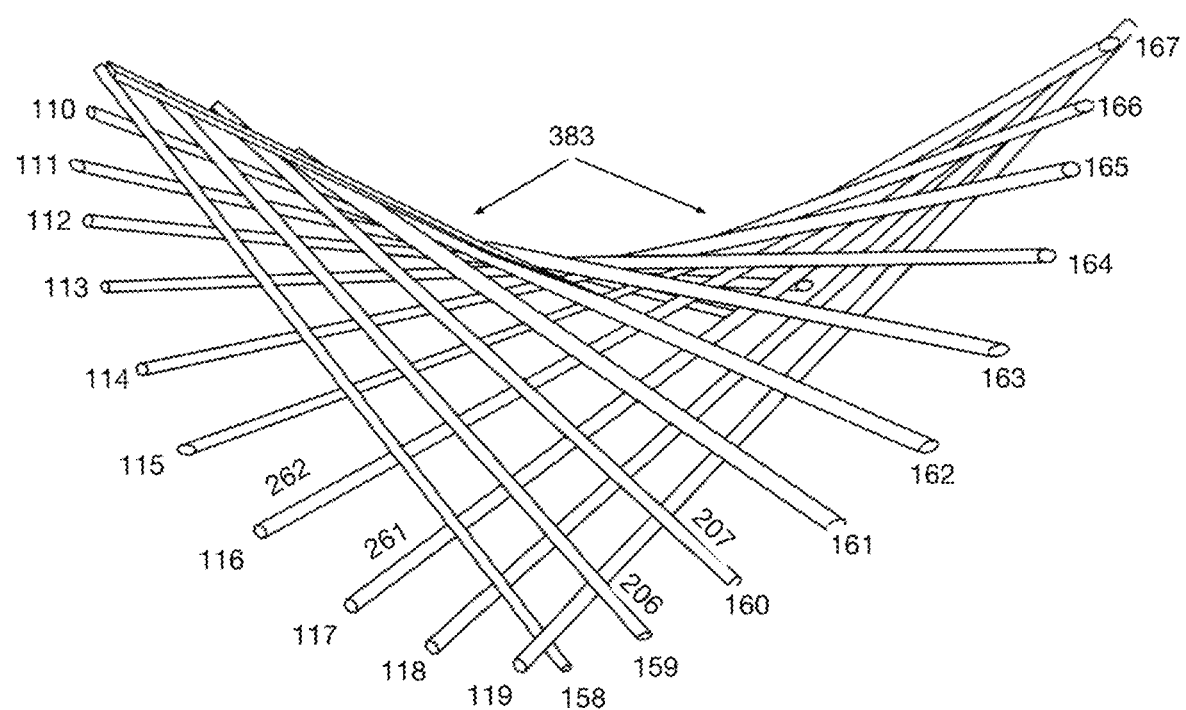

Reference is made to FIGS. 21 and 22, which are simplified illustrations of emitter beams and corridors of maximum detection for proximity sensors configured to detect presence of an object in 3D space, in accordance with embodiments of the present invention. FIG. 21 shows emitters and detectors arranged alternatingly along a closed planar curve. Only two of the emitters are numbered (156, 157) and only two of the detectors are numbered (108, 109). The emitter light beams are projected upward in relation to the curve and the detectors are configured to have corridors of maximum detection that intersect multiple emitter light beams. One emitter beam is numbered (205) and one corridor of maximum detection is numbered (260). This configuration creates rings of hotspots 378-382 in the airspace above the emitters and detectors, thus providing detection of objects passing through a volume.

FIG. 22 shows beams from emitters 158-167 and corridors of maximum detection for detectors 110-119, where emitters 158-167 and detectors 110-119 are arranged along an open planar curve. The beams are directed as illustrated in the figure, in which two emitter beams are numbered (206, 207). The detectors are configured such that their respective corridors of maximum detection intersect multiple emitter beams, as illustrated in the figure. Two corridors of maximum detection are numbered in the FIG. 261, 262). This creates an array of hotspots 383 in the shape of a hyperbolic paraboloid known as a saddle roof form.

In mobile phones, tablet computers, connected-home devices and vehicle cabins, the optical sensor components are mounted along one or more edges of the display. The emitter beams are directed upward through the display glass. In contrast to optical touchscreens that project beams parallel to the display cover glass, this gesture sensor configured to detect gestures opposite the display glass does not require a raised bezel around the display, as the light beams are directed out of the display rather than parallel to the display surface.

Figure 23:
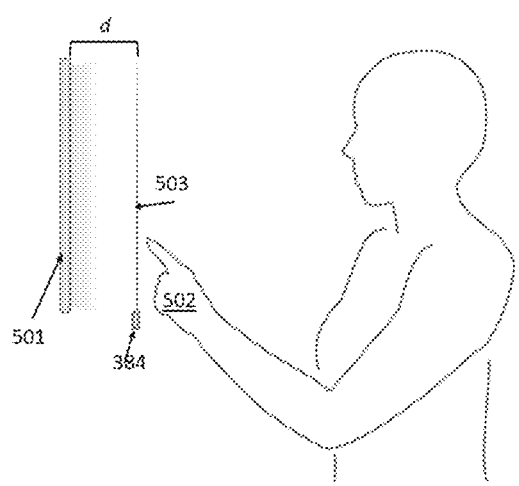
FIGS. 23-25 are simplified illustrations of contactless touch input systems, in accordance with embodiments of the present invention.
Figure 24:
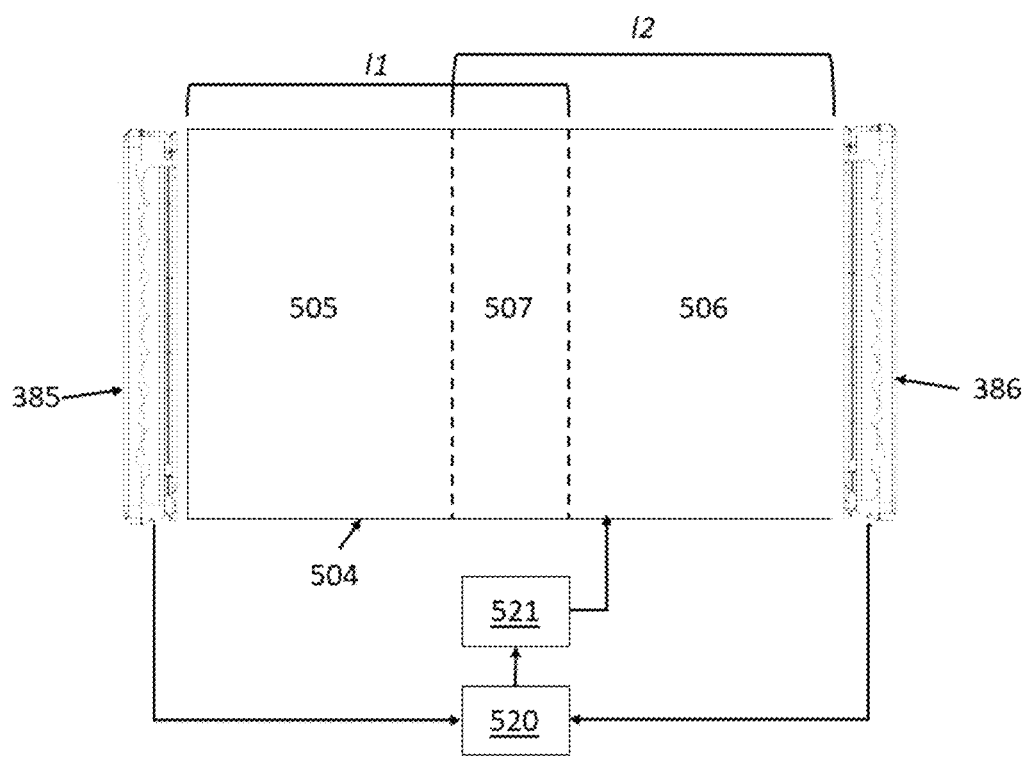
Figure 25:
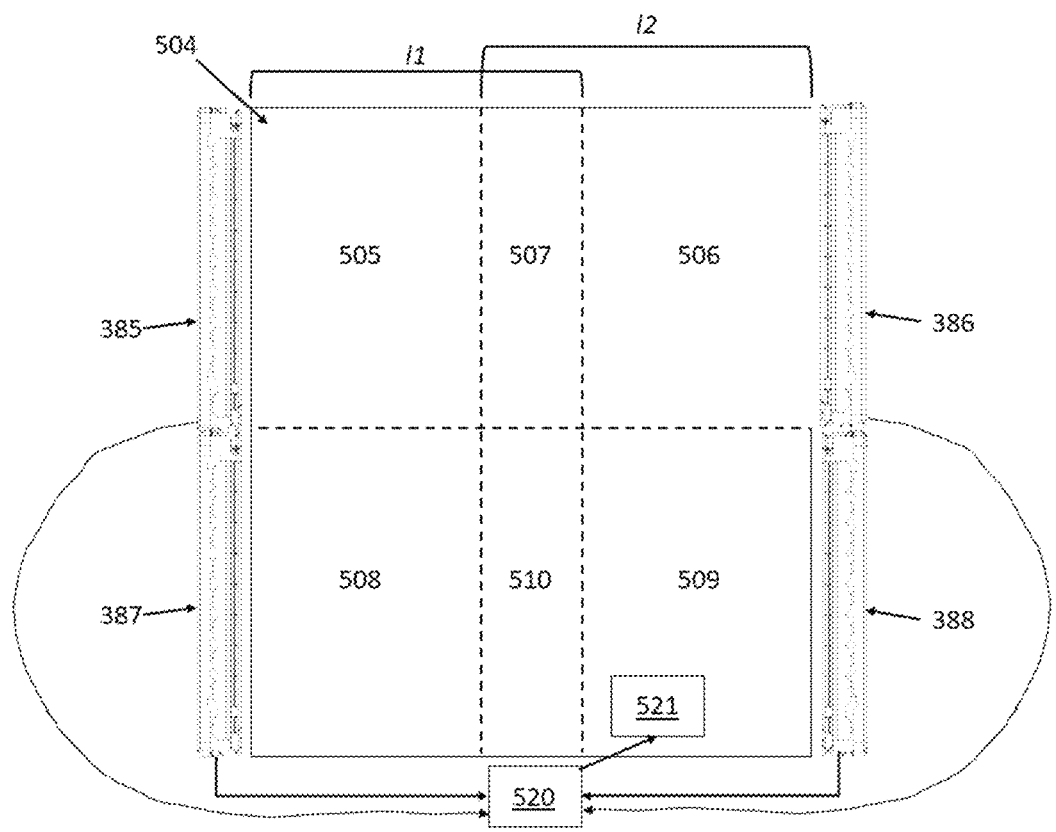

Reference is made to FIGS. 23-25, which are simplified illustrations of contactless touch input systems, in accordance with embodiments of the present invention. FIG. 23 shows a side view of a contactless touchscreen system designed to reduce or eliminate contact between a user 502 and the touchscreen 501. The contactless touchscreen system includes display 501 and a proximity sensor 384 mounted a distance away from display 501, creating a touch detection plane 503 that is parallel to, and above, the upper surface of display 501. FIG. 23 shows touch detection plane 503 separated by a distance d from the upper surface of display 501. User 502 may interact with a user interface presented on display 501 without touching the display, as every coordinate in detection plane 503 is mapped to a corresponding coordinate on display 501. Any gesture performed by the user by inserting a finger or object into detection plane 503 is detected by sensor 384 and reported to the user interface using a standard protocol such as the USB human interface device class (USB HID class). Thus, the underlying computer system does not require any modification. The computer system receives inputs from sensor 384 as if the inputs were touchscreen inputs.

Such inputs are not limited to selecting on-screen icons. Additional in-air gestures detected by sensor 384 and reported to the system include swipe gestures, e.g., to pan or scroll the display, and two-finger pinch gestures to zoom-in and zoom-out. If the system is used in a self-checkout kiosk, the user may enter a signature to validate credit card payment by gesturing in-air in detection plane 503 and sensor 384 reports the signature gesture coordinates to the system.

The system illustrated in FIG. 23 applies to physical button and knob interfaces as well. For example, an elevator keypad replaces display 501, whereby user 502 selects a button by performing a press gesture into detection plane 503 at a location mapped to the underlying button. Sensor 384 reports the location on the keypad, or the corresponding button, as having been pressed by the user to the elevator button panel control system.

In another example a panel having physical slider controls and rotatable knobs replaces display 501. A swipe gesture detected in detection plane 503 opposite a slider control is reported as movement along the slider to increase or decrease an input value. A two-finger spread gesture detected in detection plane 503 opposite a rotatable knob is interpreted as rotating the knob to the right, and a two-finger pinch gesture detected in detection plane 503 opposite the rotatable knob is interpreted as rotating the knob to the left.

When the display or button panel dimensions are large, it is advantageous to enable a system in which multiple sensors are used instead of one large sensor. In embodiments of the invention, two sensors are mounted facing each other along opposite edges of the display or button panel, where each sensor's detection zone covers only a portion of the display, but the two sensors together cover the full display.

FIG. 24 shows such a system. FIG. 24 shows display 504 and sensors 385 and 386 mounted along opposite short edges of display 504. Each sensor's detection area covers a portion of the upper surface of display 504. In FIG. 24, sensor 385 has a detection area 505 which extends from left to right a distance l1 across display 504, and sensor 386 has a detection area 506 which extends from right to left a distance l2 across display 504. Area 507 in the middle of display 504 is covered by both detection areas 505 and 506. In embodiments of the invention, sensors 385 and 386 are mounted to provide a detection plane above the upper surface of display 504 in order to enable contactless interaction, as discussed hereinabove with respect to FIG. 23.

In order to combine the outputs from sensors 385 and 386 into a touchscreen input, both sensors 385 and 386 send their respective outputs to processor 520 that combines the outputs and then sends the combined output as touch input to computer 521 running the display and user interface. In some embodiments, processor 520 is an ARM® processor in a Raspberry Pi™ single board computer running the Linux® operating system. ARM is a registered trademark of Arm Limited. RASPBERRY PI is a trademark of RASPBERRY PI FOUNDATION. LINUX is a registered trademark of Linus Torvalds in the U.S. and other countries.

FIG. 25 shows another embodiment of the invention in which multiple pairs of sensors (385-386 and 387-388) are mounted along the two opposite edges of display 504. Each sensor detects objects in one of detection areas 505, 506, 508 and 509, respectively. FIG. 25 also shows areas 507 and 510 where two detection areas overlap. Sensors 385-388 all send their outputs to processor 520 to be combined and sent to computer 521 as touchscreen input.

Figure 26:
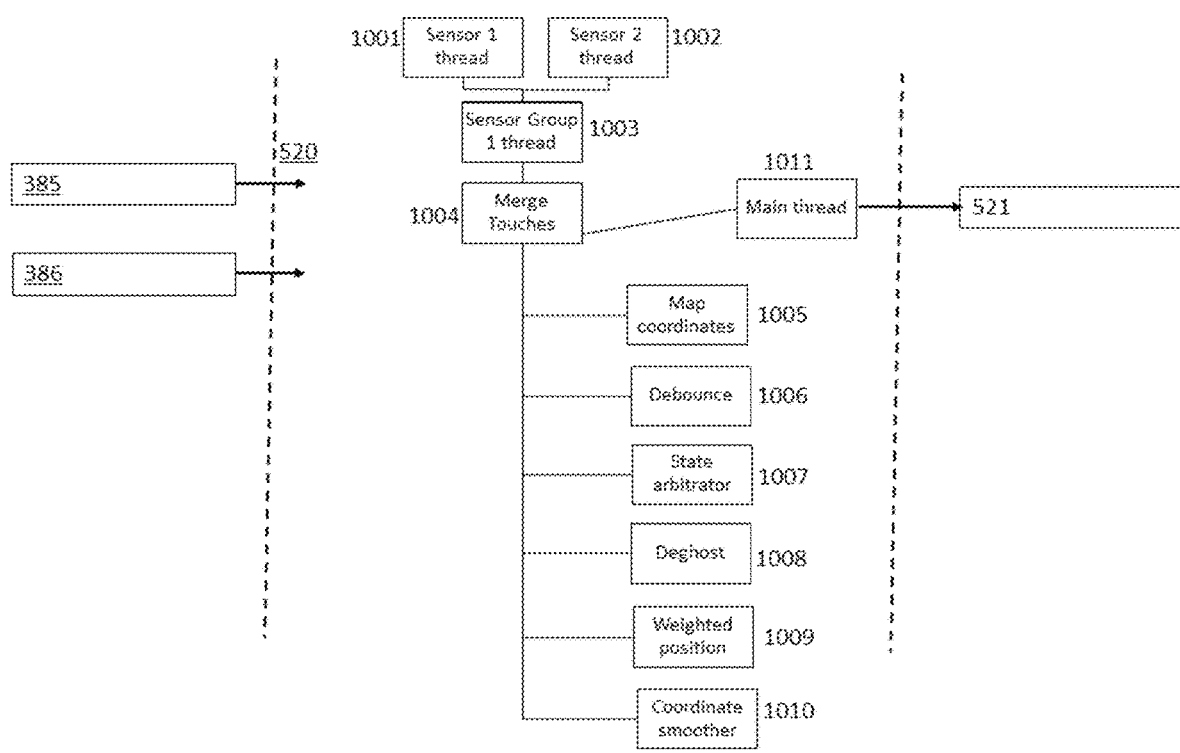
FIG. 26 is a flowchart for a process of combining touch outputs from opposite reflective sensors in a contactless touch input system, in accordance with embodiments of the present invention.

Reference is made to FIG. 26, which is a flowchart for a process of combining touch outputs from opposite reflective sensors in a contactless touch input system, in accordance with embodiments of the present invention. FIG. 26 shows a flowchart of software functions performed by processor 520. Processor 520 runs a separate thread (1001, 1002) for each connected sensor. Every pair of opposite sensors sends their thread outputs to a sensor group thread (1003), which calls a Merge Touches function (1004), which performs the following functions: Map Coordinates (1005), Debounce (1006), State Arbitrator (1007), Deghost (1008), Weighted Position (1009), and Coordinate Smoother (1010). When there is more than one pair of opposite sensors in the system, and multiple group threads are used, output from the Merge Touches function from each group thread is sent to a main thread 1011 that sends the final touch information to computer 521. In certain systems with only one pair of opposite sensors, the main thread combines data from the two sensor threads and calls the Merge Touches function (1004). In this case, group thread (1003) is not required. A description of functions 1005-1010 is provided below.

Function 1005 Map Coordinates—the sensors are facing different directions, so their outputs are not addressing the same coordinate space. This function maps each sensor's outputs to a shared coordinate space.

Function 1006 Debounce—using the output from function 1005, this function tries to detect fast flickering between 'down' and 'up' states, and suppress such flickering. This mostly occurs when an object is in the overlapping areas 507 and 510, where the signals are weak and the border of the active/non-active area is wavy.

Function 1007 State Arbitrator—using the output from function 1006 this function defines a state for the current touch. The states are discussed hereinbelow with reference to FIG. 27.

Function 1008 Deghost—this function identifies touch outputs from each sensor that were likely generated by the sensor detecting an emitter beam from the opposite sensor. This is based, for example, on a touch coordinate that suddenly appears at a distance away from a previous touch location.

Function 1009 Weighted Position—if two sensors both reported valid touch locations, this function combines the two locations based on a weighted sum, assigning greater weight to the output from the sensor closer to the touch location.

Function 1010 Smoother—this function applies a state-based rolling average filter to the output of function 1009. The result is the output of the Merge Touches function. All group threads are merged to provide a single output for the main thread, and this main thread output is sent to the system as touch data from a single HID (absolute mouse, digitizer, or other HID profiles) device.

Figure 27:
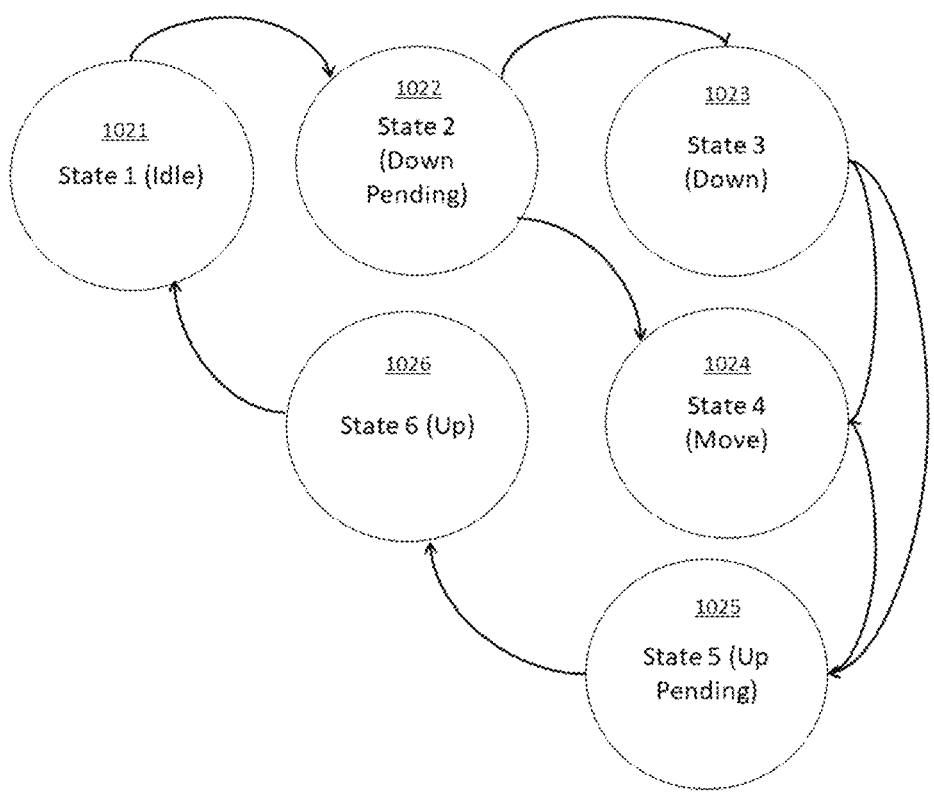
FIG. 27 is an illustration of a state machine validating and tracking touch inputs in a contactless touch input system, in accordance with embodiments of the present invention.

Reference is made to FIG. 27, which is an illustration of a state machine validating and tracking touch inputs in a contactless touch input system, in accordance with embodiments of the present invention. FIG. 27 shows the states 1021-1026 assigned to touch data by function 1007 State Arbitrator. The state begins at state 1 Idle (1021). When a touch is first detected, the state is advanced to state 2 Down Pending (1022). In this state the system waits to see if the touch disappears, in which case it was likely caused by noise, e.g., from the other sensor, and should be discarded. Thus, if the touch disappears the state returns to Idle; if the touch persists for a period of time it is confirmed. The state for a thus confirmed touch proceeds to either state 3 Down (1023) or state 4 Move (1024). State 3 Down (1023) applies when a confirmed touch from state 2 remained at the same location. This is equivalent to a touch-down event in other GUI systems. State 4 Move (1024) applies when a confirmed touch from state 2 or state 3 has moved to a new location.

State 5 Up Pending (1025) applies when a touch from state 3 or 4 has been lifted. This state waits to see if the touch remains absent. If touch remains absent for a period of time, the state is updated to state 6 Up (1026) confirming that the touch has ended. The state is returned to state 1 Idle.

The present invention covers systems featuring electronic display screens as well as systems featuring static images; e.g., printed matter. In particular, the invention includes printed matter that a user interacts with when the sensor of the present invention detects gestures at locations that correspond to symbols in the printed matter. The invention also includes a hologram of a printed or etched image that the user interacts with when the sensor of the present invention detects gestures at locations that correspond to symbols in the hologram. The present invention also includes input devices in which the input GUI is projected into airspace or onto a reflective surface, such as a head up display.

A contactless interface according to the present invention provides a GUI featuring one or more interactive elements and one or more in-air detection planes for detecting user input gestures. The system receives user input by mapping the detected gestures to respective ones of the GUI elements. As user interaction with the detection planes is performed in-air, without touching any surfaces, systems of the present invention prevent the transmission of pathogens that would otherwise occur via touch input surfaces touched by multiple individuals.

One of the issues addressed by the present invention is how the system distinguishes between user selection of a GUI element and activation of that element. Another issue addressed by the present invention is, how to intuitively communicate to users when and how their gestures are being received and interpreted as input by the system.

Figure 28:
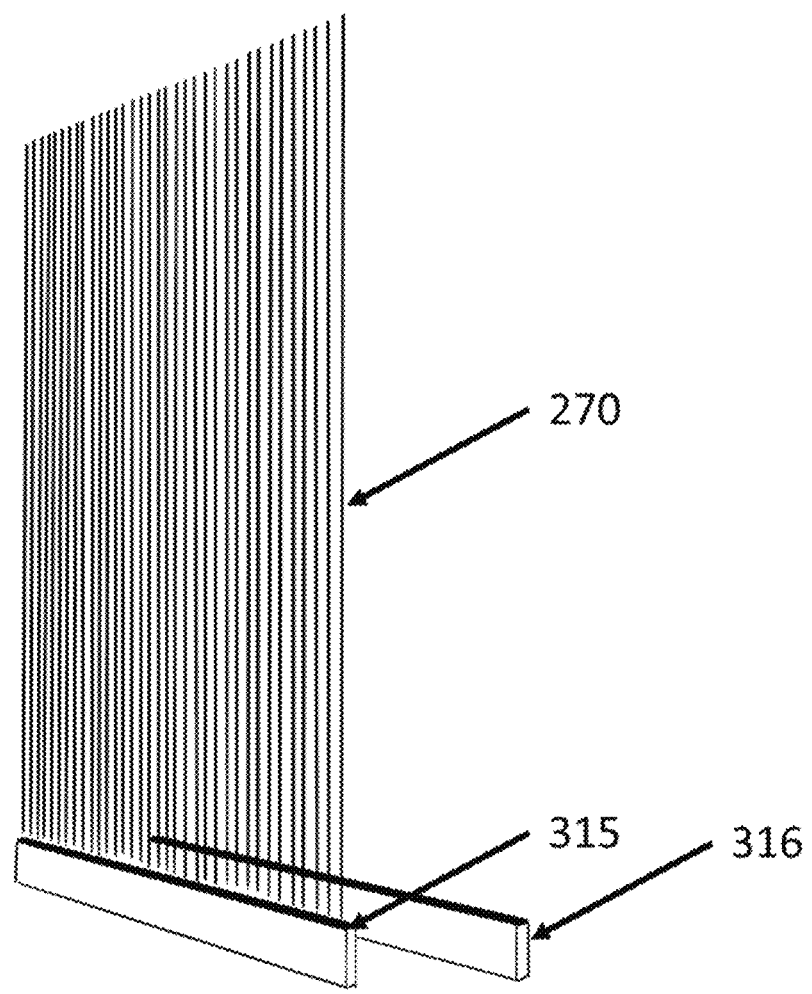
FIGS. 28-32 are simplified illustrations of elements in a contactless optical touchscreen system, in accordance with embodiments of the present invention.

Reference is made to FIGS. 28-32, which are simplified illustrations of elements in a contactless optical touchscreen system, in accordance with embodiments of the present invention. FIG. 28 shows two optical proximity sensors 315 and 316 arranged parallel to one another. A detection field of light beams 270 is shown projected upwards in the airspace above sensor 315. Sensors 315 and 316 are described in U.S. Pat. Nos. 9,164,625, 9,921,661, 10,282,034 and 10,324,565, the contents of which are incorporated herein in their entireties by reference.

Figure 29:
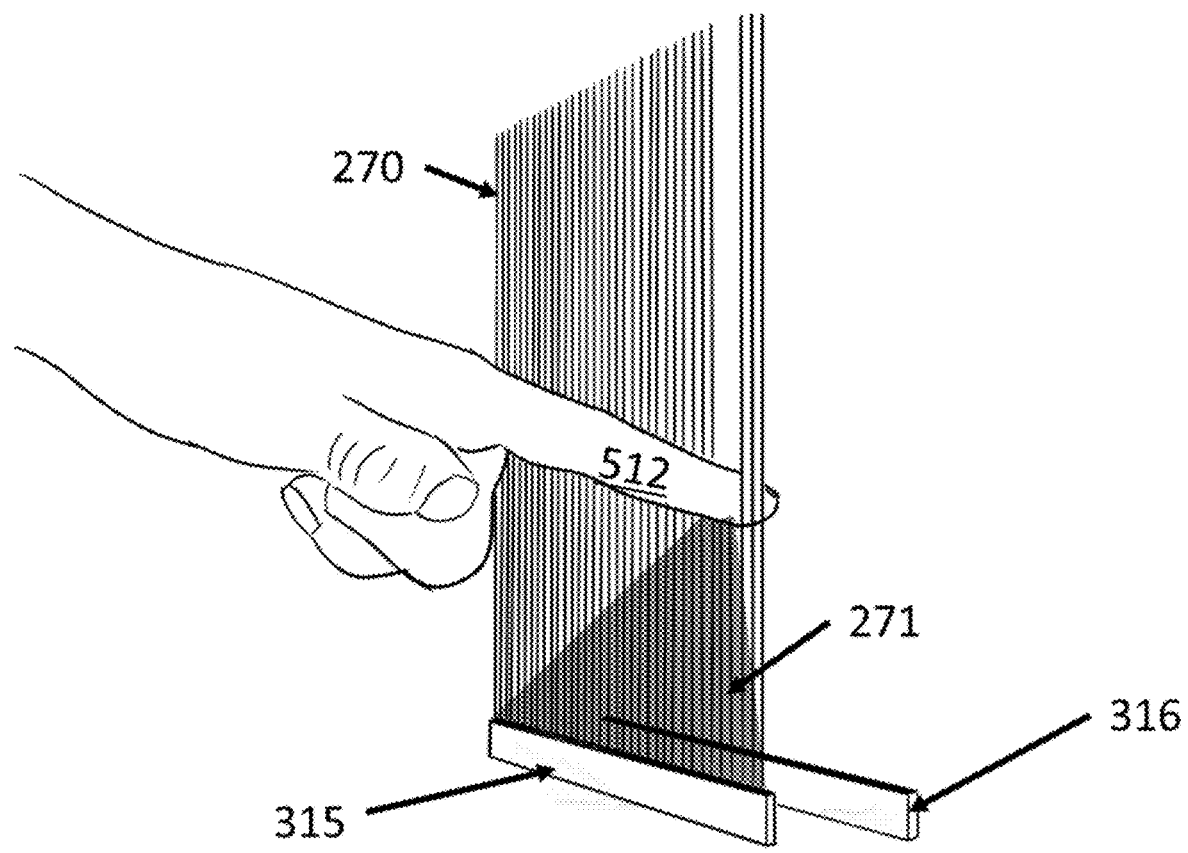

FIG. 29 shows how sensor 315 detects the two-dimensional location of an object, such as finger 512, inserted into detection field 270. As explained in U.S. Pat. Nos. 9,164,625, 9,921,661, 10,282,034 and 10,324,565, reflections 271 by finger 512 of projected light field 270 are used to triangulate the object's location within light field 270.

Figure 30:
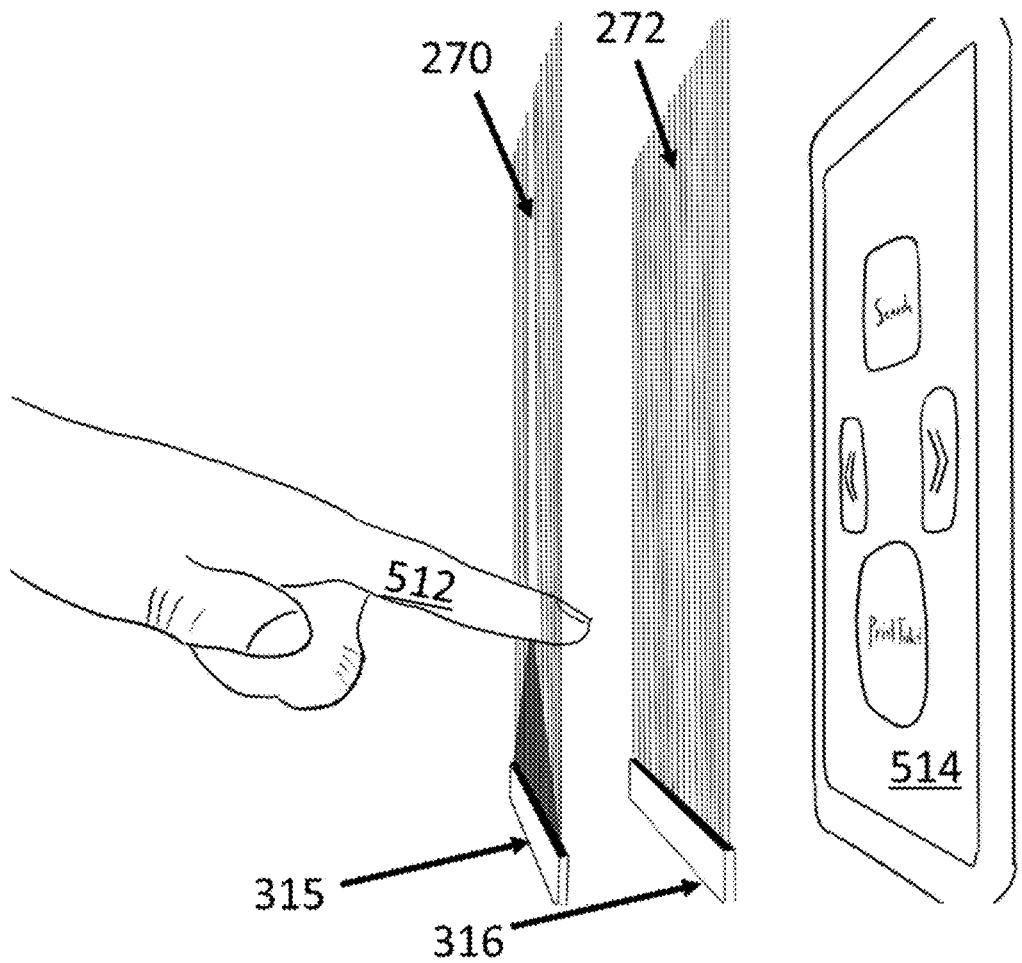
Figure 31:
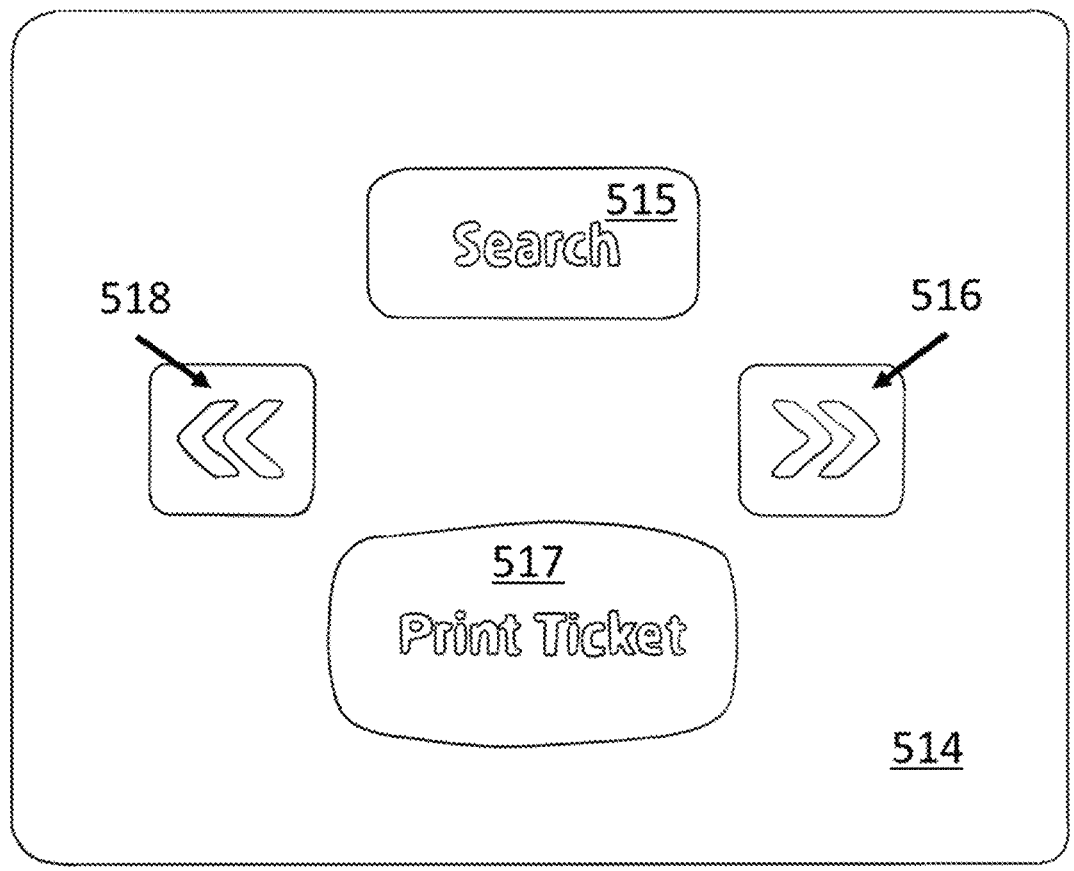

FIG. 30 is a perspective view from one side of an input system in accordance with the present invention. Display 514 is mounted behind and away from proximity sensors 315 and 316. Proximity sensors 315 and 316 provide two, parallel detection planes 270 and 272 above the plane of display 514. The location of finger 512 in detection plane 270, detected by sensor 315, is mapped to a corresponding location on display 514. This enables the user to move finger 512 to select and deselect different GUI elements shown on display 514. FIG. 31 shows GUI elements 515 ("search"), 516 ("forward"), 517 ("print") and 518 ("back"), on display 514. When any of these GUI elements is selected by finger 512 interacting with sensor 315, this selection is indicated to the user, e.g., by enlarging the selected GUI element on display 514. In order to activate a selected GUI element, the user translates finger 512 into detection plane 272 of proximity sensor 316.

Figure 32:
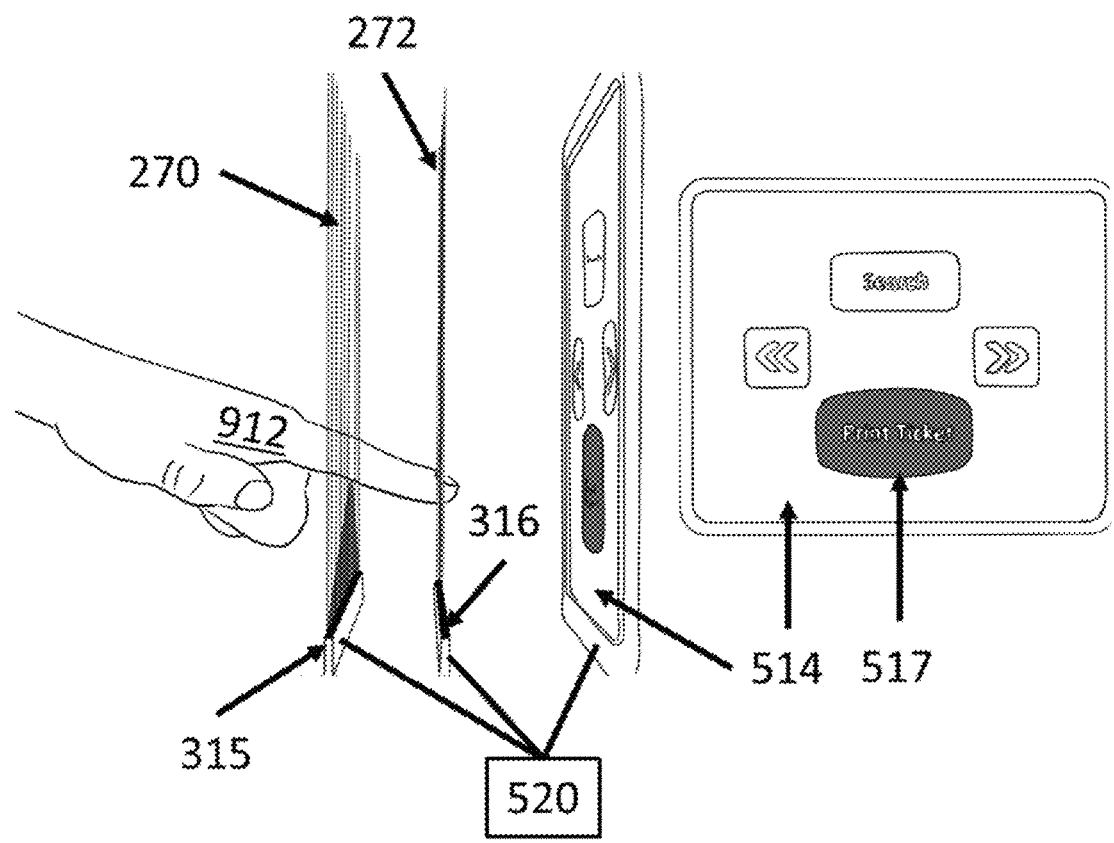

FIG. 32 shows finger 512 translated into detection plane 272 of proximity sensor 316 and thereby activating selected GUI element 517 ("print ticket"). This activation is indicated to the user, e.g., by changing the color of the activated GUI element. This activation is controlled by processor 520, connected to sensors 315 and 316, and to display 514.

Indications to the user are not limited to graphical changes on the display. In some embodiments of the invention, sensors 315 and 316 include visible-light emitters that are selectively activated to provide feedback to the user. For example, when an object enters detection plane 270, a first visible-light emitter is activated to illuminate the object in a first color. When the object is translated into detection plane 272 of proximity sensor 316, a second visible-light emitter, on proximity sensor 315 or on proximity sensor 316, is activated to illuminate the object in a second color. When finger 512 moves within detection plane 270, visible-light emitter activations indicate whether the corresponding cursor on the display 514 has selected a GUI element; e.g., a low-intensity illumination of the finger indicates that the cursor is located between GUI elements, and a high-intensity illumination indicates that the cursor is located at one of the GUI elements and has thus selected that element.

Figure 33:
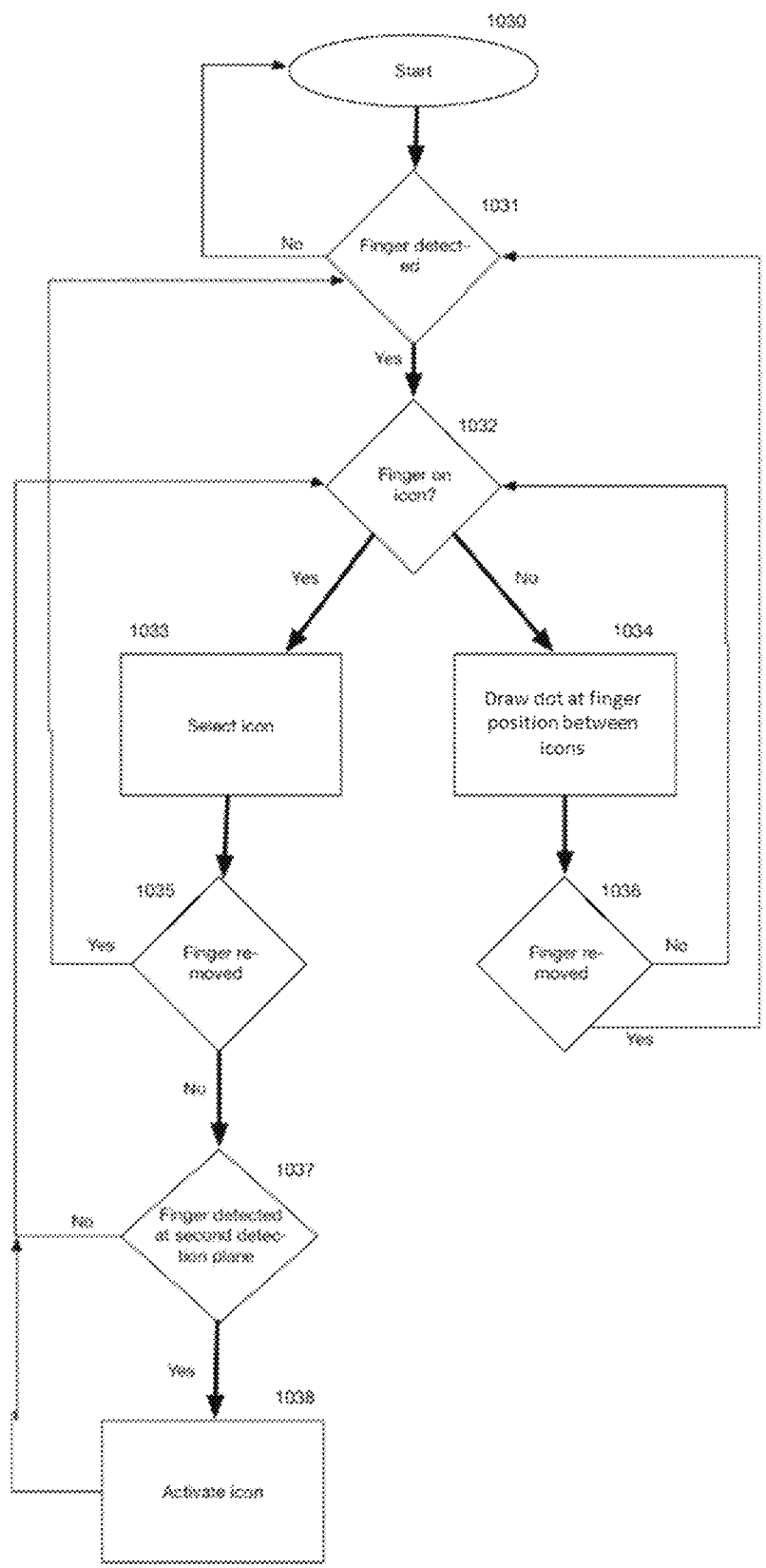
FIG. 33 is a flowchart describing first a user interface for a contactless optical touchscreen system, in accordance with an embodiment of the present invention.

Reference is made to FIG. 33, which is a flowchart describing first a user interface for a contactless optical touchscreen system, in accordance with an embodiment of the present invention. After the system starts (operation 1030), sensor 315 polls the detection plane 270 to see if an object has entered the plane (operation 1031). If yes, the process proceeds to determine whether the object is at a location in detection plane 270 corresponding to any of the icons on display 514 (operation 1032). If yes, that icon is selected (operation 1033), e.g., by highlighting the icon; whereas, if not, the display renders a cursor, e.g., a circle, on the display at a location corresponding to the location of the object in detection plane 270 (operation 1034). The appearance of either this cursor (operation 1034) or the visual indication of the selected icon (operation 1033) indicates the current interaction with detection plane 270 and thus, interaction with the displayed GUI. As such, if the finger is subsequently removed from detection plane 270, the cursor or graphical indication of a selected icon disappears (icon selection canceled when operation 1035 returns to operation 1031; cursor erased when operation 1036 returns to operation 1031). As the finger moves within detection plane 270, the display reacts by either rendering the cursor at corresponding locations between icons on the display (operation 1034) or by highlighting a selected icon (operation 1033). It is intuitive for the user that when an icon is selected the circle representing the cursor disappears and instead, the selected icon is highlighted. This is further enhanced when the cursor appears to be attracted to an icon as it approaches the icon, e.g., an animation of the circle being drawn to the icon and melting into the highlighted icon. This animation also makes it easy for the user to select icons, as it is sufficient for the cursor to approach an icon in order to select that icon. To deselect an icon, the user translates finger 512 out of its present location in detection plane 270. This prompts the highlighting to be turned off and the cursor to reappear at a new location outside the deselected icon. If, when an icon is selected, sensor 316 detects that finger 512 has entered detection plane 272 (operation 1037), the selected icon is activated (operation 1038).

Figure 34:
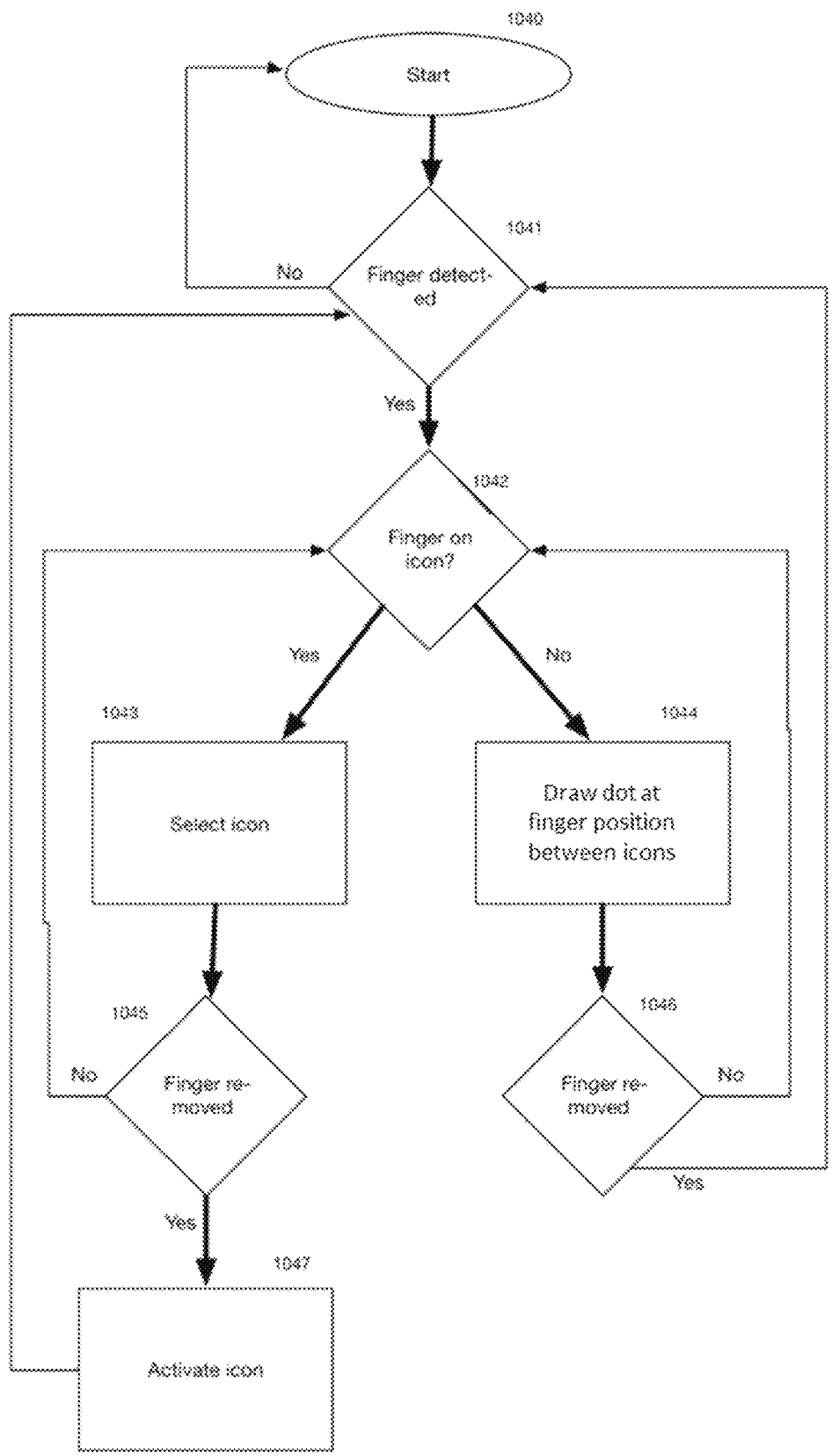
FIG. 34 is a flowchart describing second a user interface for a contactless optical touchscreen system, in accordance with an embodiment of the present invention.

Reference is made to FIG. 34, which is a flowchart describing second a user interface for a contactless optical touchscreen system, in accordance with an embodiment of the present invention. The method of FIG. 34 differs from that of FIG. 33 in that the method of FIG. 34 uses only one sensor and only one detection plane, i.e., sensor 315 and detection plane 270. After the system starts (operation 1040), sensor 315 polls the detection plane 270 to see if an object has entered the plane (operation 1041). If yes, the process proceeds to determine whether the object is at a location in detection plane 270 corresponding to any of the icons on display 514 (operation 1042). If yes, that icon is selected (operation 1043); if not, the display renders a cursor on the display at a location corresponding to the location of the object in detection plane 270 (operation 1044). The appearance of either this cursor (operation 1043) or the visual indication of the selected icon (operation 1044) indicates to the user that he is currently interacting with detection plane 270 and thus, interacting with the displayed GUI. As such, if the finger is subsequently removed from detection plane 270 when the cursor is rendered on the display, the cursor disappears (returning from operation 1046 to operation 1041). As the finger moves within detection plane 270, the display reacts by either rendering the cursor at corresponding locations between icons on the display, or by highlighting the selected icon. It is intuitive for the user that when an icon is selected the cursor disappears and instead, the selected icon is highlighted. This is further enhanced when the cursor appears to be attracted to an icon as it approaches the icon, e.g., an animation of the cursor being drawn to the icon and melting into the highlighted icon. This animation also makes it easy for the user to select icons, as it is sufficient for the cursor to approach an icon in order to select that icon. To deselect an icon, the user translates finger 512 out of its present location in detection plane 270. This prompts the highlighting to be turned off and the cursor to reappear at a new location outside the deselected icon (advancing from operation 1045 to operation 1042 to operation 1044). To activate a selected icon, the user translates finger 512 out of the icon location in detection plane 270 (operation 1047).

In certain embodiments of the invention, display 514 is replaced by a reflection of a display, e.g., a head up display, where the reflection surface is set back from detection plane 270.

In certain embodiments of the invention, detection plane 270 is created by an optical sensor having emitters and detectors on opposite edges of plane 270. In other embodiments of the invention, two detection planes 270 and 272 are created by two stacked sensors having emitters and detectors on opposite edges of planes 270 and 272. Optical sensors having emitters and detectors on opposite edges of one or more detection planes are described in U.S. Pat. No. 8,416, 217, the contents of which are hereby incorporated herein in their entirety by reference.

In certain embodiments of the invention, an interface for entering a personal PIN or other sensitive data is provided where the display is encased in a hood or box that blocks others from viewing the data being entered by the user. In this case, the hood or box opening provides a frame surrounding detection plane 270 for housing an optical sensor having emitters and detectors on opposite edges of the detection plane. When an inclined or sloping reflective surface at the far end of this hood is the display seen by the user of this hooded input system, users intuitively understand that they are not required to touch the distant, inclined display surface. This makes interaction with a detection plane near the opening of the hood intuitive to the user.

In other embodiments, a holograph with GUI elements, e.g., representing numbered buttons in an elevator for selecting a floor or product names in a vending machine, is generated in-air. The sensor is configured to create a detection plane that is coplanar with the holograph, enabling the user to interact with the holograph as a standard button interface, except that no surfaces are touched. A system having a holograph coplanar with a detection plane is described in U.S. Pat. No. 10,282,034 and illustrated therein at least at FIG. 40.

In other embodiments, a physical button keypad, such as an elevator keypad, or product buttons or printed selection options on a vending machine, are provided at a distance behind detection plane 270 discussed hereinabove to enable contactless button selection. In some embodiments, the detection plane is situated a distance 30 mm above the keypad. The selected button is highlighted as a conventional button is, when pressed. In this case, simply inserting finger 512 at the location in detection plane 270 corresponding to a specific one of the buttons activates that button.

In the foregoing specification, the invention has been described with reference to specific exemplary embodiments thereof. It will, however, be evident that various modifications and changes may be made to the specific exemplary embodiments without departing from the broader spirit and scope of the invention. For example, technologies such as radar, cameras, time-of-flight cameras and capacitive sensors may be used instead of the optical sensors discussed hereinabove. Accordingly, the specification and drawings are to be regarded in an illustrative rather than a restrictive sense.

What is claimed is:

1. A proximity sensor, comprising:
   a circuit board;
   a plurality of light emitters mounted on said circuit board;
   a plurality of light detectors mounted on said circuit board;
   two stacked lenses, positioned above said light emitters and said light detectors, comprising an extruded cylindrical lens collimating light along a width of the sensor and a Fresnel lens array collimating light along a length of the sensor, wherein each of said emitters, when activated, projects a light beam through said two stacked lenses along a common projection plane, wherein a reflective object located in the common projection plane above said two stacked lenses reflects light projected at the reflective object from one or more of said emitters to one or more of said detectors, and wherein each emitter-detector pair, comprising one of said emitters and one of said detectors, when synchronously activated, is expected to generate a greater detection signal at the activated detector, when the reflective object is located at a specific 2D location in the common projection plane corresponding to the emitter-detector pair, than when the reflective object is located at any other location in the common projection plane; and
   a processor connected to said emitters and to said detectors, sequentially activating each of said emitters and synchronously co-activate one or more of said detectors, and identifying a location of the reflective object in the common projection plane, based on amounts of light detected by the detector of each synchronously activated emitter-detector pair.

2. The proximity sensor of claim 1, wherein at least one of said two stacked lenses is a collimating lens for the projected light beams.

3. The proximity sensor of claim 2, wherein said Fresnel lens array is configured to collimate the projected light beams.

4. The proximity sensor of claim 1, wherein said extruded cylindrical lens is positioned between said Fresnel lens array and said circuit board.

5. The proximity sensor of claim 1, wherein said extruded cylindrical lens serves as a support structure for the sensor.

6. The proximity sensor of claim 1, wherein said processor is further configured to identify gestures performed by the reflective object in the common projection plane, based on amounts of light detected by the detector of each synchronously activated emitter-detector pair.

7. The proximity sensor of claim 1, wherein said processor is further configured to identify an edge shape of the reflective object by generating a pixel image having pixel values based on assigning values corresponding to the amount of light detected by each detector of a plurality of synchronously activated emitter-detector pairs to the specific 2D location corresponding to the emitter-detector pair, and correlating the generated pixel image with a reference edge shape.

8. The proximity sensor of claim 1, wherein said processor is configured to identify gestures performed by the reflective object, by correlating a time series of pixel images, each pixel image comprising pixel values that are based on assigning values corresponding to the amount of light detected by the detector of each synchronously activated emitter-detector pair to the specific 2D location corresponding to the emitter-detector pair.

9. The proximity sensor of claim 1, wherein said processor is configured to generate:
  a first vector, the components of which correspond to the emitters, the components comprising, for each emitter, a sum of values corresponding to amounts of light detected by the detector of each synchronously activated emitter-detector pair having that emitter, and
  a second vector, the components of which correspond to distances from the sensor, the components comprising a sum of values corresponding to amounts of light detected by the detector of each synchronously activated emitter-detector pair whose corresponding specific 2D location is the same distance from the sensor,
and wherein said processor is further configured to calculate at least one member of the group consisting of movement, velocity, size and location of the reflective object, along a first dimension of the common projection plane, based on the first vector, and along a second dimension of the common projection plane, based on the second vector.

10. The proximity sensor of claim 1, wherein said two stacked lenses fan out the light beams from said plurality of light emitters in non-parallel non-intersecting directions along the common projection plane.

11. The proximity sensor of claim 1, encased in hermetically sealed plastic transparent to infrared light.

* * * * *